United States Patent
Takahashi et al.

(10) Patent No.: US 10,580,976 B2
(45) Date of Patent: Mar. 3, 2020

(54) THREE-DIMENSIONAL PHASE CHANGE MEMORY DEVICE HAVING A LATERALLY CONSTRICTED ELEMENT AND METHOD OF MAKING THE SAME

(71) Applicant: SANDISK TECHNOLOGIES LLC, Plano, TX (US)

(72) Inventors: Yuji Takahashi, San Jose, CA (US); Vincent Shih, San Jose, CA (US); Christopher Petti, Mountain View, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/924,944

(22) Filed: Mar. 19, 2018

(65) Prior Publication Data

US 2019/0288192 A1    Sep. 19, 2019

(51) Int. Cl.
*H01L 45/00*    (2006.01)

(52) U.S. Cl.
CPC ............ *H01L 45/06* (2013.01); *H01L 45/124* (2013.01); *H01L 45/1253* (2013.01); *H01L 45/144* (2013.01); *H01L 45/149* (2013.01); *H01L 45/1616* (2013.01); *G11C 2213/50* (2013.01); *G11C 2213/71* (2013.01)

(58) Field of Classification Search
None
See application file for complete search history.

(56) References Cited

U.S. PATENT DOCUMENTS

| | | |
|---|---|---|
| 3,972,059 A | 7/1976 | DiStefano |
| 5,535,156 A | 7/1996 | Levy et al. |
| 5,768,192 A | 6/1998 | Eitan |
| 5,936,274 A | 8/1999 | Forbes et al. |

(Continued)

FOREIGN PATENT DOCUMENTS

WO    WO 2009/091786 A1    7/2009

OTHER PUBLICATIONS

Kau, D.C. et al., "A Stackable Cross Point Phase Change Memory," IEEE, pp. IEDM09-617 to IEDM09-620, (2009).
(Continued)

*Primary Examiner* — J. H. Hur
(74) *Attorney, Agent, or Firm* — The Marbury Law Group, PLLC

(57) ABSTRACT

A phase change memory device includes first conductive rails laterally extending along a first horizontal direction over a substrate, a rectangular array of memory pillar structures overlying top surfaces of the first conductive rails, and second conductive rails laterally extending along a second horizontal direction and overlying top surfaces of the rectangular array of memory pillar structures. Each memory pillar structure includes a vertical stack of structural elements including, from one end to another, a selector-side conductive element, a selector element, a selector-memory conductive element, a phase change memory element, and a memory-side conductive element. At least one structural element within the vertical stack is a laterally constricted structural element having laterally recessed sidewalls relative to sidewalls of a respective immediately vertically underlying structural element.

11 Claims, 29 Drawing Sheets

(56) References Cited

U.S. PATENT DOCUMENTS

| | | |
|---|---|---|
| 6,011,725 A | 1/2000 | Eitan |
| 6,015,738 A | 1/2000 | Levy et al. |
| 6,285,055 B1 | 9/2001 | Gosain et al. |
| 6,580,124 B1 | 6/2003 | Cleeves et al. |
| 6,853,049 B2 | 2/2005 | Herner |
| 6,881,994 B2 | 4/2005 | Lee et al. |
| 7,285,464 B2 | 10/2007 | Herner et al. |
| 7,378,870 B2 | 5/2008 | Mouttet |
| 7,579,232 B1 | 8/2009 | Ping et al. |
| 7,733,685 B2 | 6/2010 | Scheuerlein et al. |
| 7,745,312 B2 | 6/2010 | Herner et al. |
| 7,800,933 B2 | 9/2010 | Kumar et al. |
| 7,830,697 B2 | 11/2010 | Herner |
| 7,851,851 B2 | 12/2010 | Mokhlesi et al. |
| 7,906,392 B2 | 3/2011 | Dunton et al. |
| 7,923,812 B2 | 4/2011 | Scheuerlein |
| 7,943,515 B2 | 5/2011 | Scheuerlein |
| 8,097,498 B2 | 1/2012 | Purayath et al. |
| 8,222,091 B2 | 7/2012 | Purayath et al. |
| 8,345,472 B2 | 1/2013 | Lee et al. |
| 8,349,681 B2 | 1/2013 | Alsmeier et al. |
| 9,343,507 B2 | 5/2016 | Takaki |
| 9,429,967 B2 | 8/2016 | Privitera et al. |
| 2003/0214856 A1 | 11/2003 | Pellizzer et al. |
| 2003/0231530 A1 | 12/2003 | Bez et al. |
| 2004/0256684 A1 | 12/2004 | Kostylev et al. |
| 2005/0048733 A1 | 3/2005 | Ashton et al. |
| 2005/0052915 A1 | 3/2005 | Herner et al. |
| 2005/0067611 A1 | 3/2005 | Ashton et al. |
| 2005/0073010 A1 | 4/2005 | Lai et al. |
| 2005/0152208 A1 | 7/2005 | Bez et al. |
| 2005/0255665 A1 | 11/2005 | Pellizer et al. |
| 2006/0030068 A1 | 2/2006 | Ashton et al. |
| 2006/0034116 A1* | 2/2006 | Lam ...................... B82Y 10/00 365/151 |
| 2006/0094197 A1 | 5/2006 | Chen et al. |
| 2006/0097342 A1 | 5/2006 | Parkinson |
| 2006/0097343 A1 | 5/2006 | Parkinson |
| 2006/0171194 A1 | 8/2006 | Lowrey et al. |
| 2006/0246606 A1 | 11/2006 | Hsu et al. |
| 2006/0266992 A1 | 11/2006 | Matsui et al. |
| 2006/0275542 A1 | 12/2006 | Mehta et al. |
| 2006/0278895 A1 | 12/2006 | Burr et al. |
| 2006/0292301 A1 | 12/2006 | Herner |
| 2007/0029607 A1 | 2/2007 | Kouznetzov |
| 2007/0072360 A1 | 3/2007 | Kumar et al. |
| 2007/0096074 A1 | 5/2007 | Asano et al. |
| 2007/0155172 A1 | 7/2007 | Lai et al. |
| 2007/0158632 A1 | 7/2007 | Ho |
| 2007/0158698 A1* | 7/2007 | Dennison ................ H01L 45/04 257/246 |
| 2007/0160760 A1 | 7/2007 | Shin et al. |
| 2007/0173063 A1 | 7/2007 | Lung |
| 2007/0290233 A1 | 12/2007 | Burr et al. |
| 2008/0049589 A1 | 2/2008 | Hong et al. |
| 2008/0050892 A1 | 2/2008 | Shin et al. |
| 2008/0116441 A1 | 5/2008 | Raghuram et al. |
| 2008/0119007 A1 | 5/2008 | Raghuram et al. |
| 2008/0131982 A1 | 6/2008 | Chen et al. |
| 2008/0186760 A1 | 8/2008 | Elmegreen et al. |
| 2008/0211539 A1 | 9/2008 | Parkinson |
| 2008/0254576 A1 | 10/2008 | Hsia et al. |
| 2008/0266930 A1 | 10/2008 | Auciello |
| 2008/0285335 A1 | 11/2008 | Elmegreen et al. |
| 2008/0302064 A1 | 12/2008 | Rauch |
| 2008/0316809 A1 | 12/2008 | Herner |
| 2009/0034325 A1 | 2/2009 | Lowrey et al. |
| 2009/0114896 A1 | 5/2009 | Kim et al. |
| 2009/0140234 A1 | 6/2009 | Moniwa et al. |
| 2009/0148980 A1 | 6/2009 | Yu |
| 2009/0179310 A1 | 7/2009 | Dunton et al. |
| 2009/0181515 A1 | 7/2009 | Herner et al. |
| 2009/0212274 A1 | 8/2009 | Breitwisch et al. |
| 2009/0215225 A1 | 8/2009 | Stender et al. |
| 2009/0283738 A1 | 11/2009 | Lee et al. |
| 2010/0019221 A1* | 1/2010 | Lung ...................... H04L 45/04 257/5 |
| 2010/0055806 A1 | 3/2010 | Auciello |
| 2010/0059796 A1 | 3/2010 | Scheuerlein |
| 2010/0200828 A1 | 8/2010 | Tominaga et al. |
| 2010/0207090 A1 | 8/2010 | Tominaga et al. |
| 2010/0225989 A1 | 9/2010 | Anders |
| 2010/0321979 A1* | 12/2010 | Yasutake ............. H01L 27/1021 365/148 |
| 2010/0323491 A1 | 12/2010 | Moniwa et al. |
| 2011/0111556 A1 | 5/2011 | Chen et al. |
| 2011/0207286 A1 | 8/2011 | Burr et al. |
| 2011/0215288 A1 | 9/2011 | Matsui et al. |
| 2011/0237045 A1 | 9/2011 | Bez et al. |
| 2012/0001679 A1 | 1/2012 | Privitera et al. |
| 2012/0026644 A1 | 2/2012 | Dunn et al. |
| 2012/0037874 A1 | 2/2012 | Moniwa et al. |
| 2012/0147648 A1 | 6/2012 | Scheuerlein |
| 2012/0155161 A1 | 6/2012 | Lee et al. |
| 2012/0251521 A1 | 10/2012 | Rostro et al. |
| 2013/0264023 A1 | 10/2013 | Hudler et al. |
| 2013/0279247 A1 | 10/2013 | Tominaga et al. |
| 2013/0286725 A1 | 10/2013 | Tominaga et al. |
| 2013/0288462 A1 | 10/2013 | Stender et al. |
| 2014/0138604 A1 | 5/2014 | Liu et al. |
| 2014/0192592 A1 | 7/2014 | Wu et al. |
| 2014/0206136 A1 | 7/2014 | Chen et al. |
| 2014/0301020 A1 | 10/2014 | Dunn et al. |
| 2014/0329357 A1 | 11/2014 | Stender et al. |
| 2015/0084156 A1* | 3/2015 | Ravasio ................. H01L 45/04 257/528 |
| 2015/0168968 A1 | 6/2015 | Privitera et al. |
| 2017/0256710 A1 | 9/2017 | Liu et al. |
| 2018/0005770 A1 | 1/2018 | Dunn et al. |

OTHER PUBLICATIONS

Wong, H.S. P. et al., "Phase Change Memory," Proceedings of the IEEE, vol. 98, No. 12, pp. 2201-2227, (2010).

U.S. Appl. No. 15/478,637, filed Apr. 4, 2017, Sandisk Technologies LLC.

U.S. Appl. No. 15/637,357, filed Jun. 29, 2017, Sandisk Technologies LLC.

U.S. Appl. No. 15/843,777, filed Dec. 15, 2017, Sandisk Technologies LLC.

U.S. Appl. No. 15/844,005, filed Dec. 15, 2017, Sandisk Tehcnologies LLC.

U.S. Appl. No. 15/888,645, filed Feb. 8, 2018, Sandisk Tehcnologies LLC.

Pirovano, A. et al., "Scaling Analysis of Phase-Change Memory Technology," IEDM Technical Digest, pp. 29.6.1-29.6.4, (2003).

Burr, G.W. et al., "Phase Change Memory Technology," Journal of Vacuum Science and Technology B, vol. 28, Issue 2, pp. 223-262, (2010).

Raoux, S. et al., "Phase-Change Random Access Memory: A Scalable Technology," IBM Journal of Research and Development, vol. 52, No. 415, pp. 465-479, (2008).

* cited by examiner

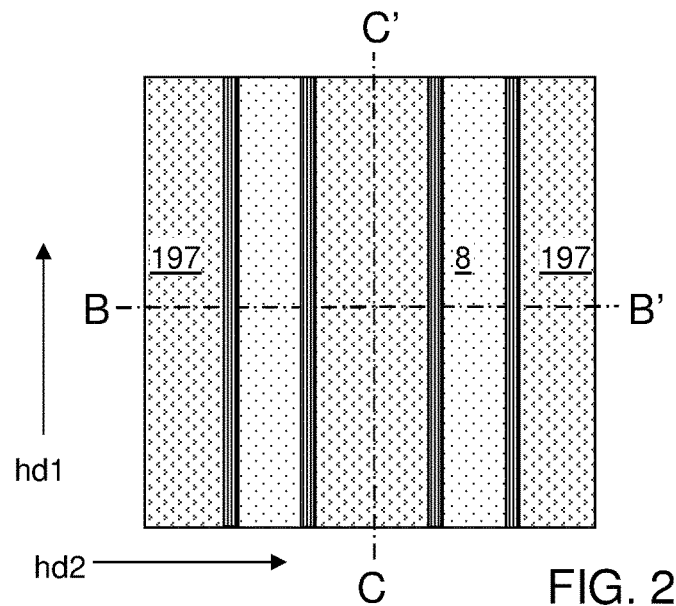
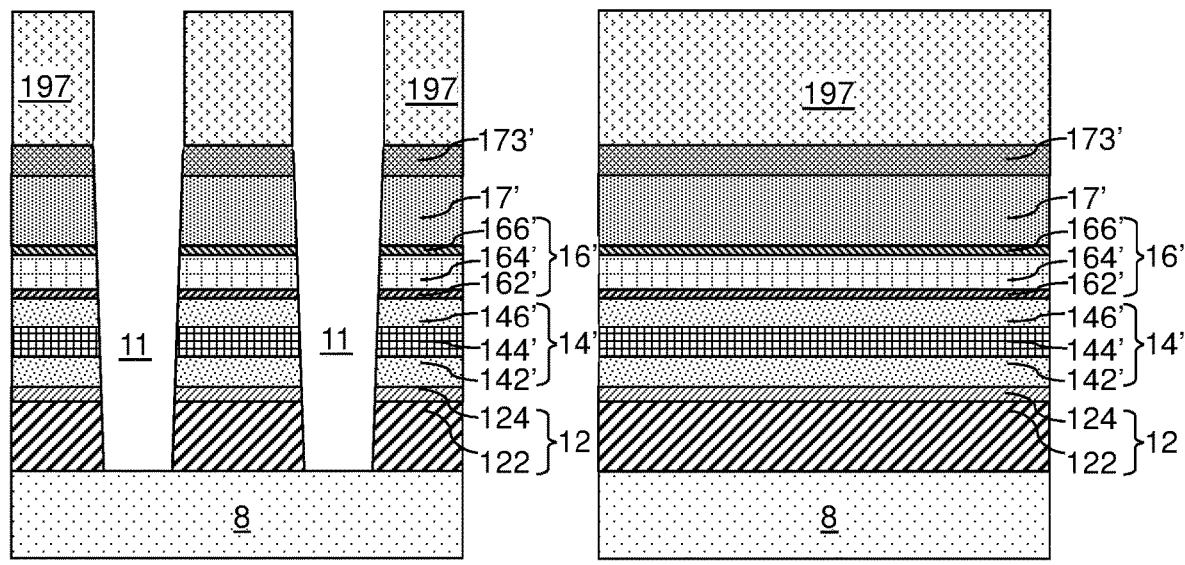
FIG. 2A
FIG. 2B
FIG. 2C

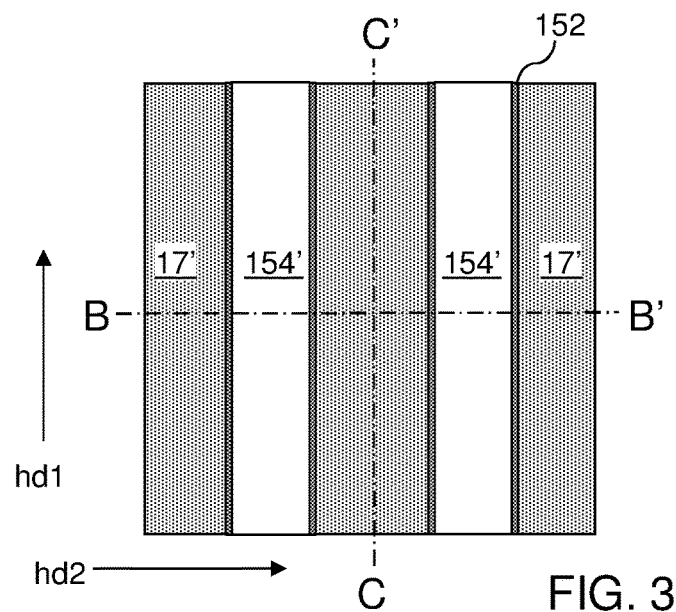
FIG. 3A
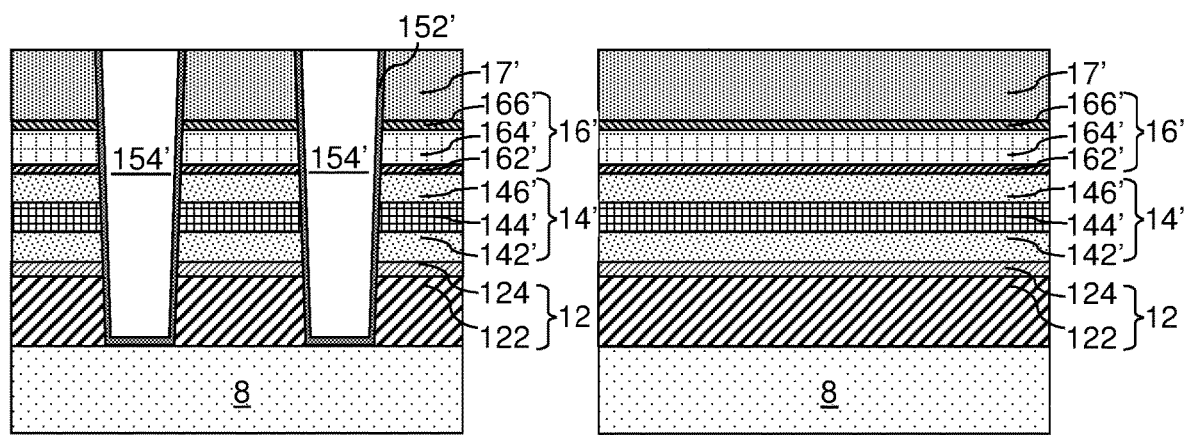
FIG. 3B
FIG. 3C

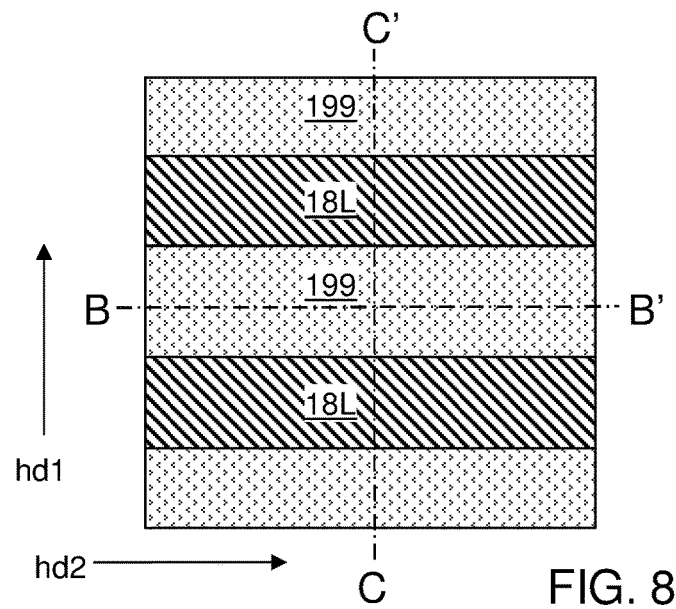
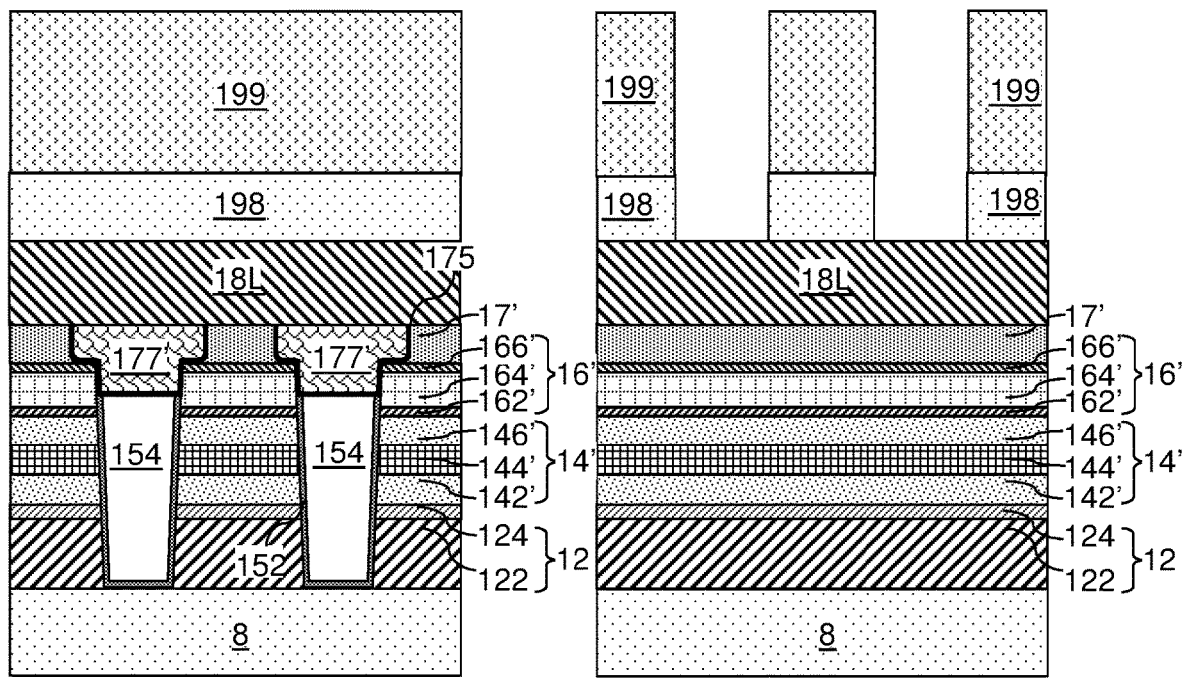
FIG. 8A
FIG. 8B
FIG. 8C

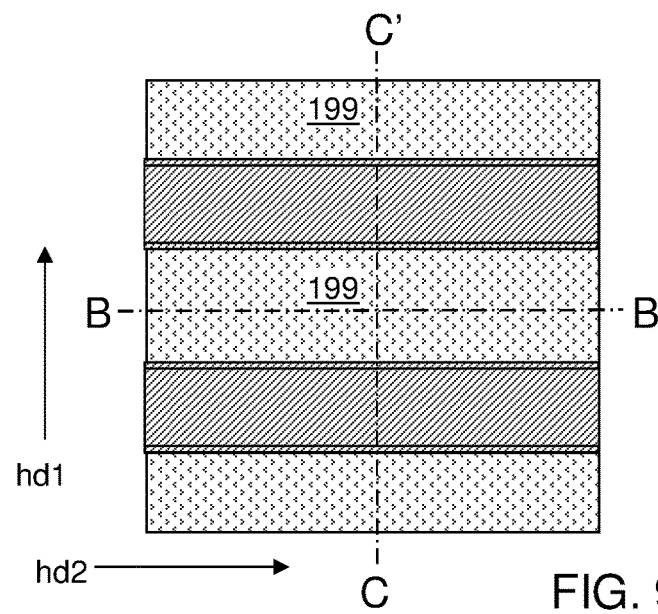
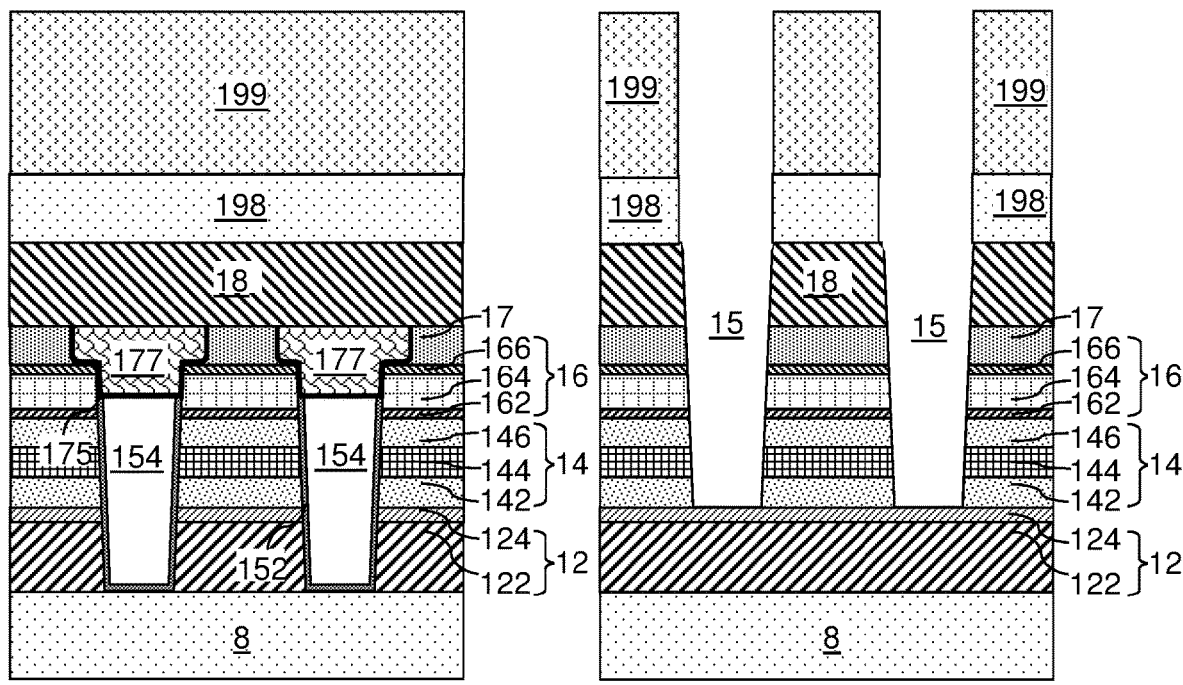
FIG. 9A
FIG. 9B
FIG. 9C

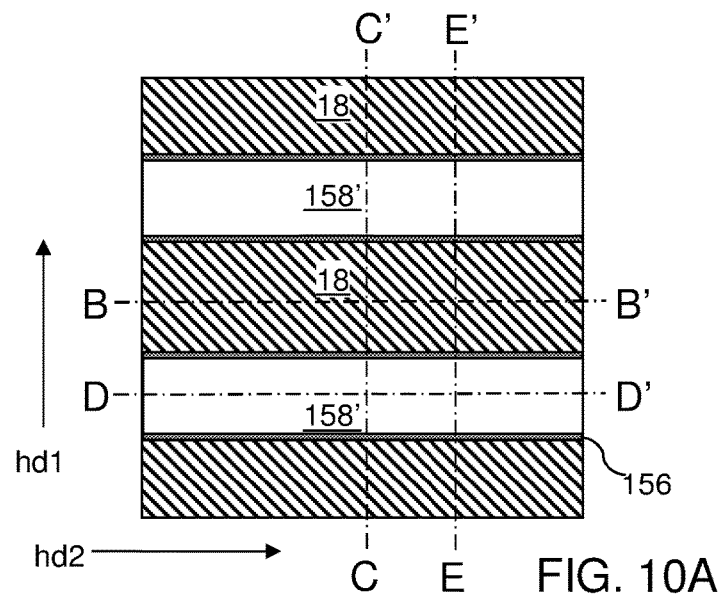
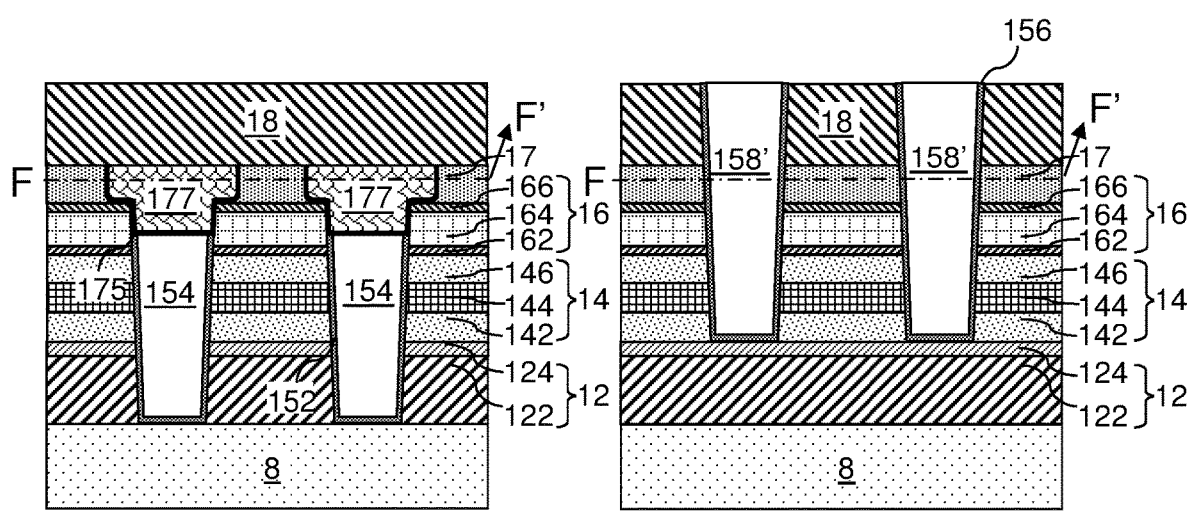
FIG. 10A
FIG. 10B
FIG. 10C

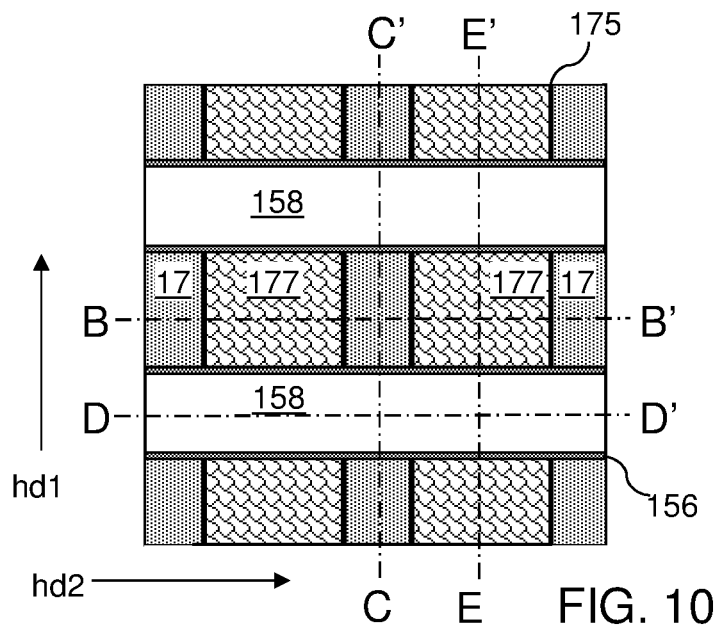
FIG. 10F
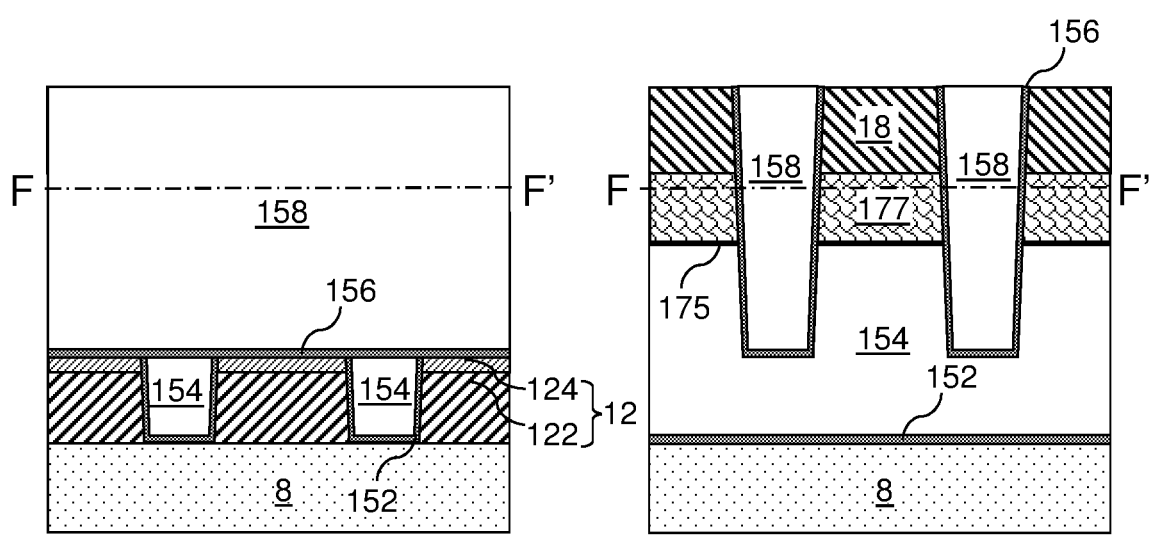
FIG. 10D
FIG. 10E

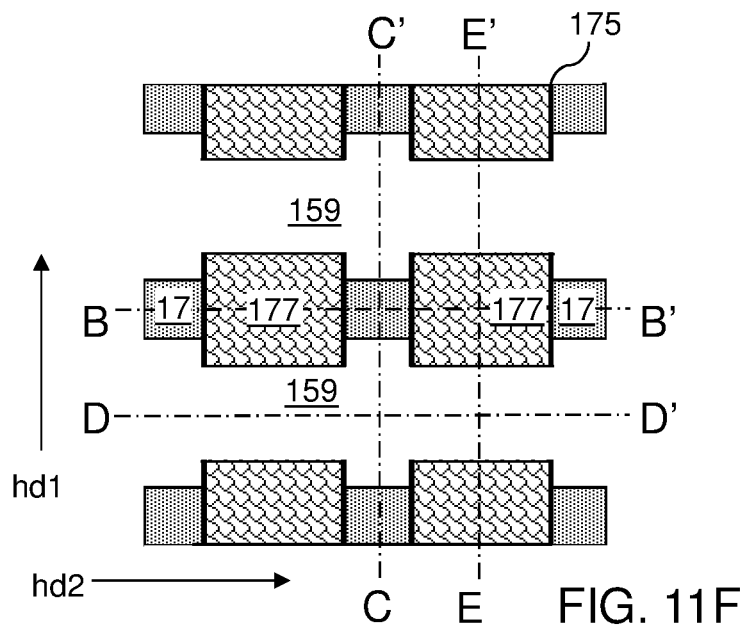
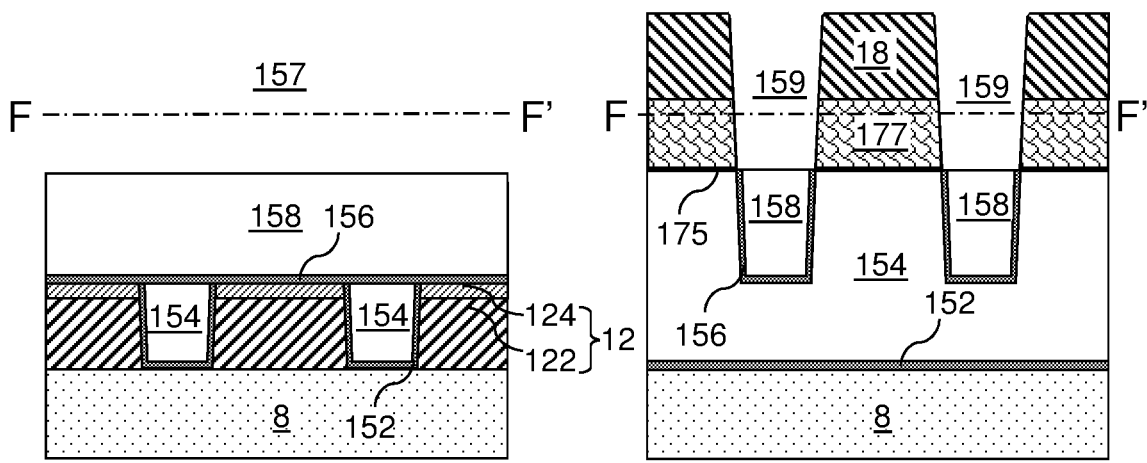
FIG. 11D    FIG. 11E    FIG. 11F

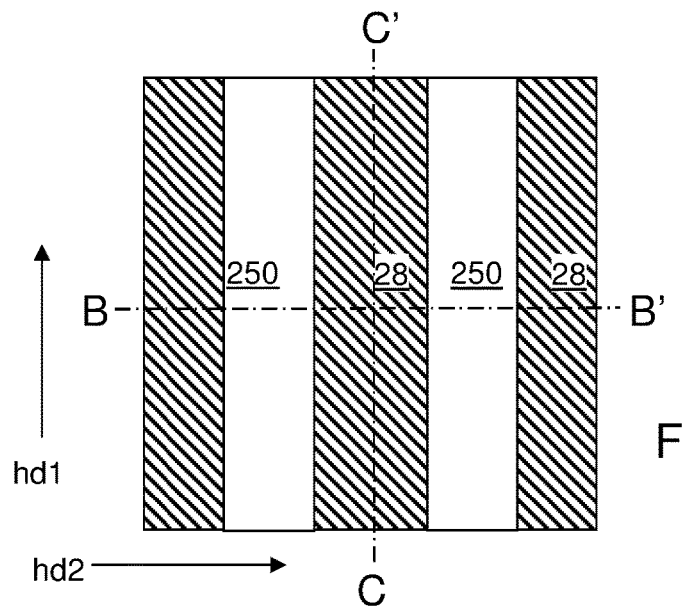
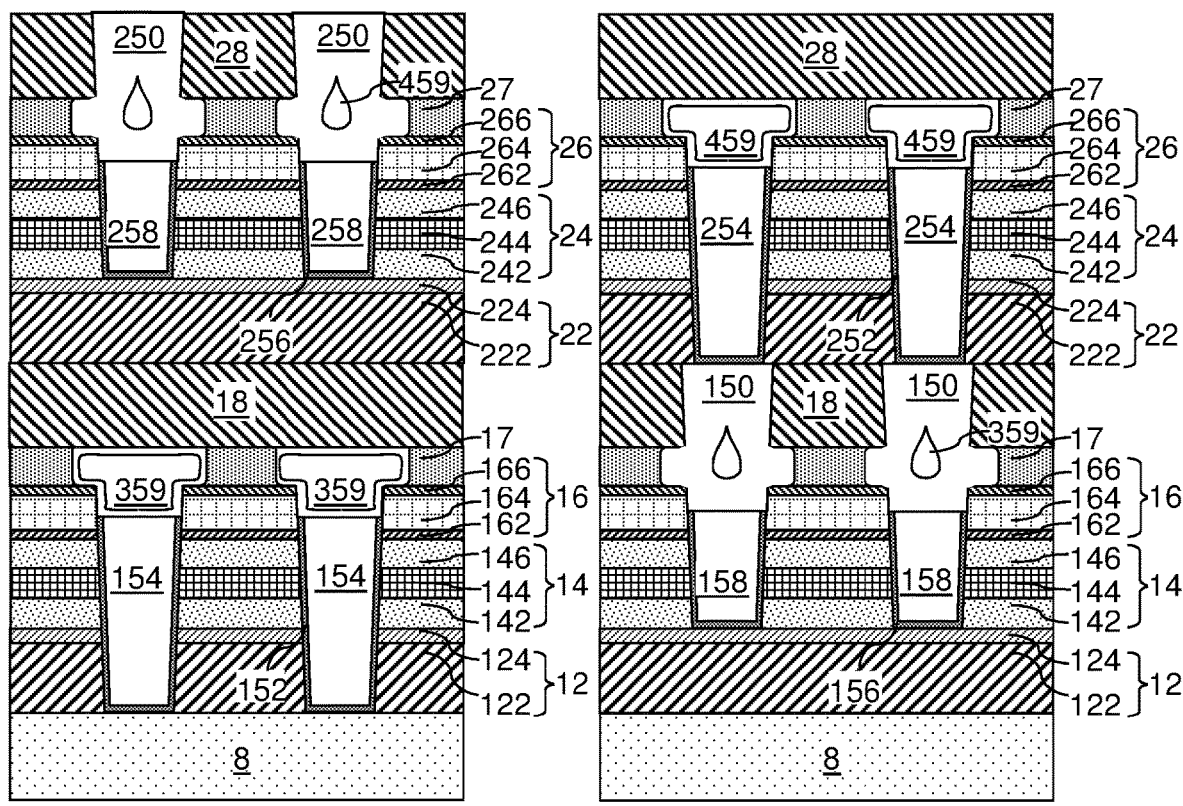
FIG. 14A
FIG. 14B  FIG. 14C

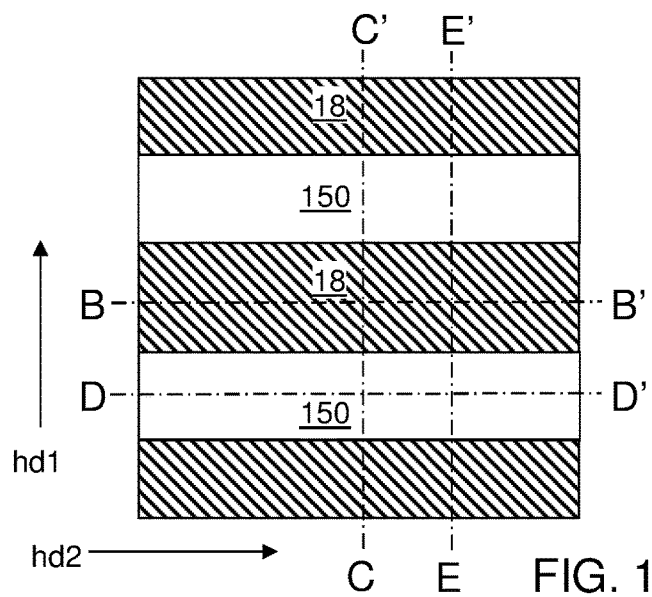
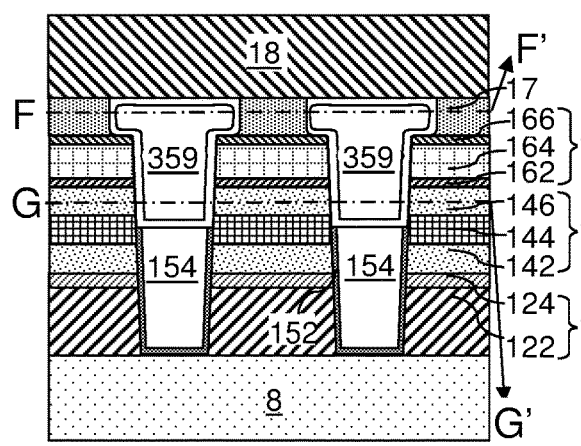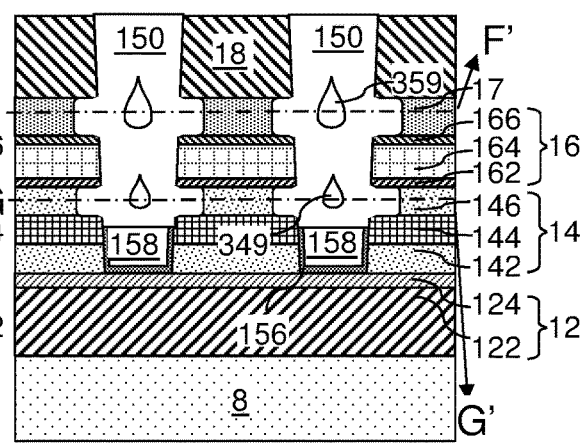
FIG. 15B  FIG. 15C

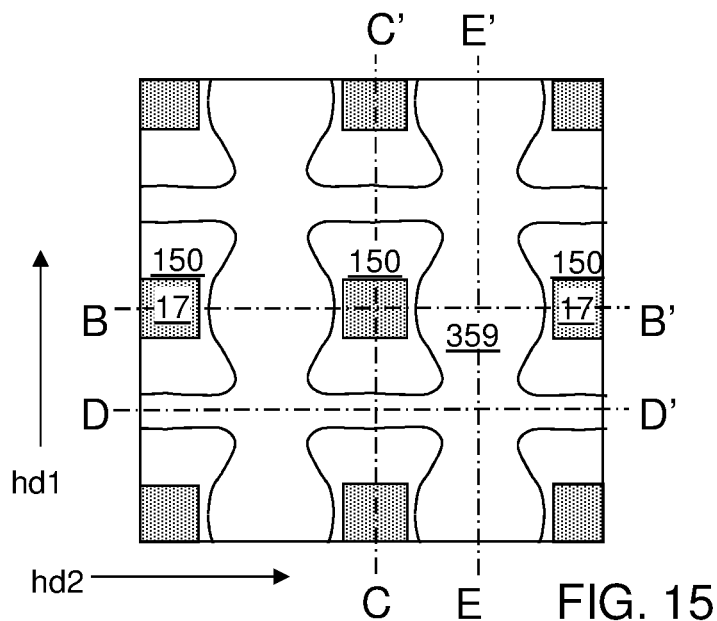
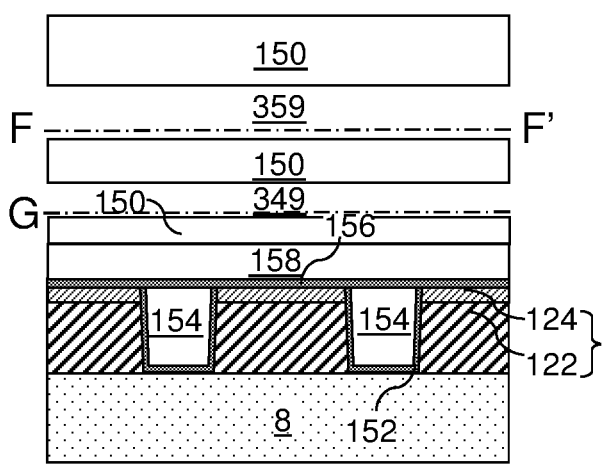
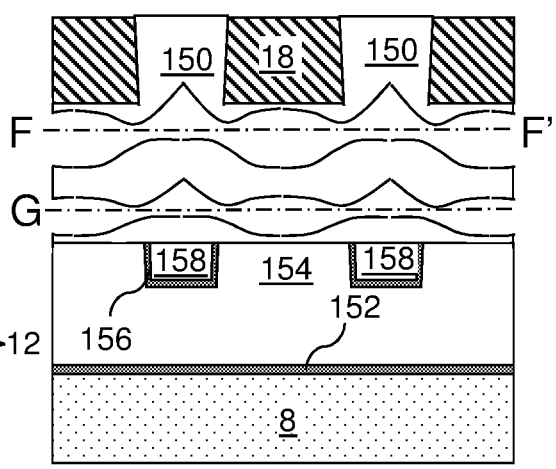
FIG. 15F
FIG. 15D
FIG. 15E

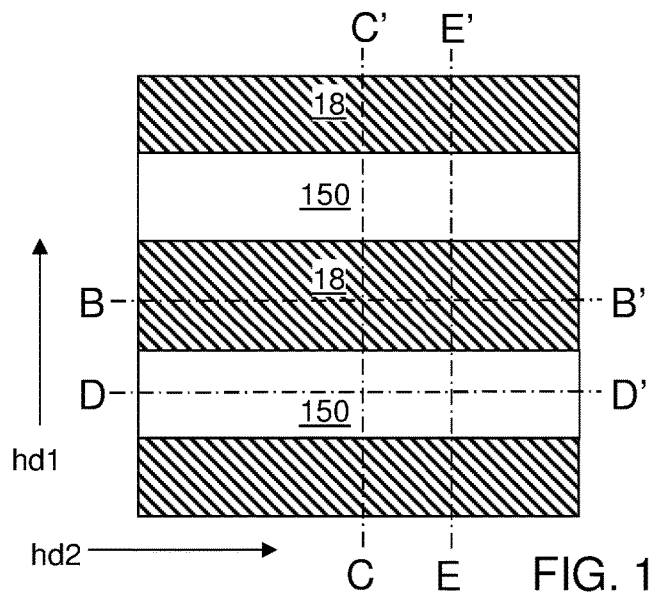
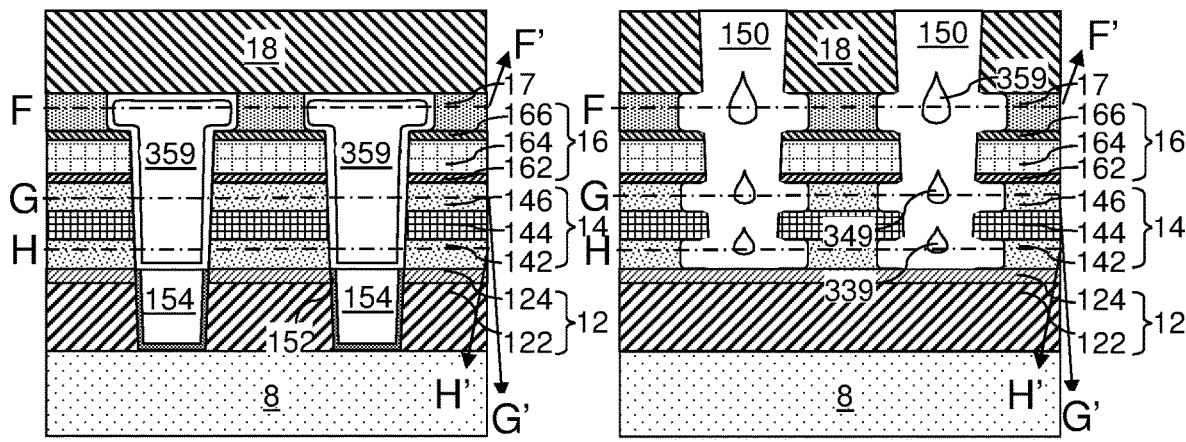
FIG. 16A
FIG. 16B
FIG. 16C

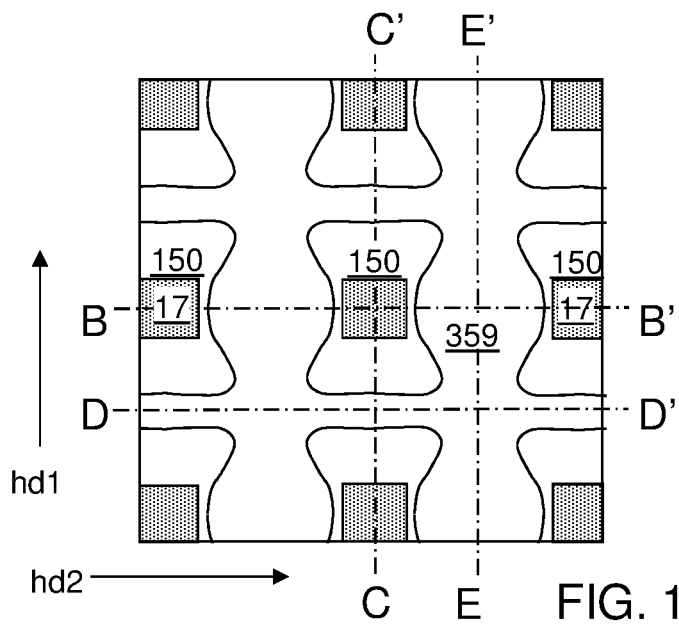
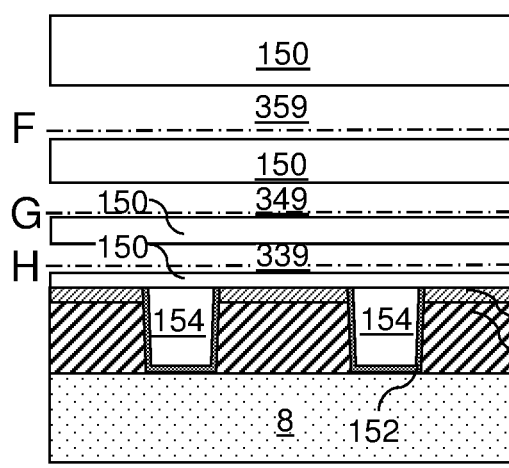
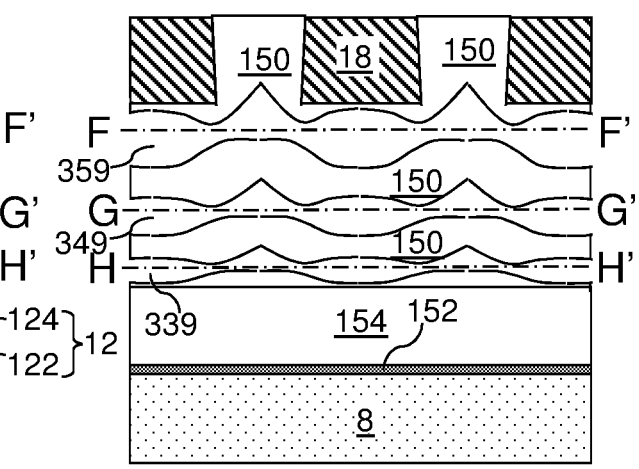
FIG. 16F
FIG. 16D
FIG. 16E

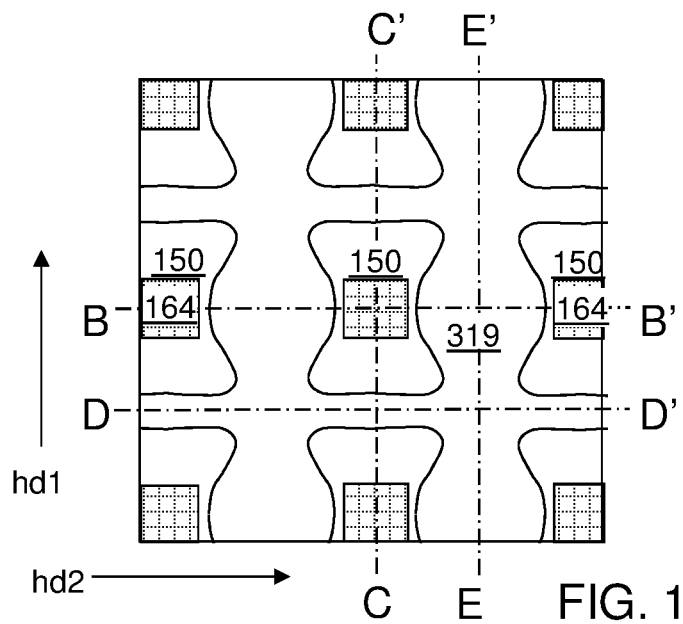
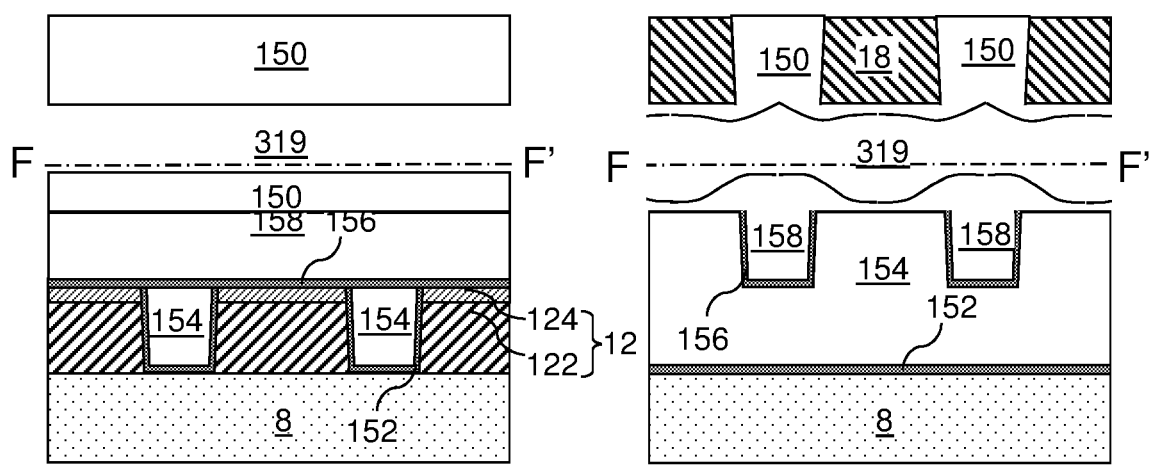
FIG. 17D  FIG. 17E  FIG. 17F

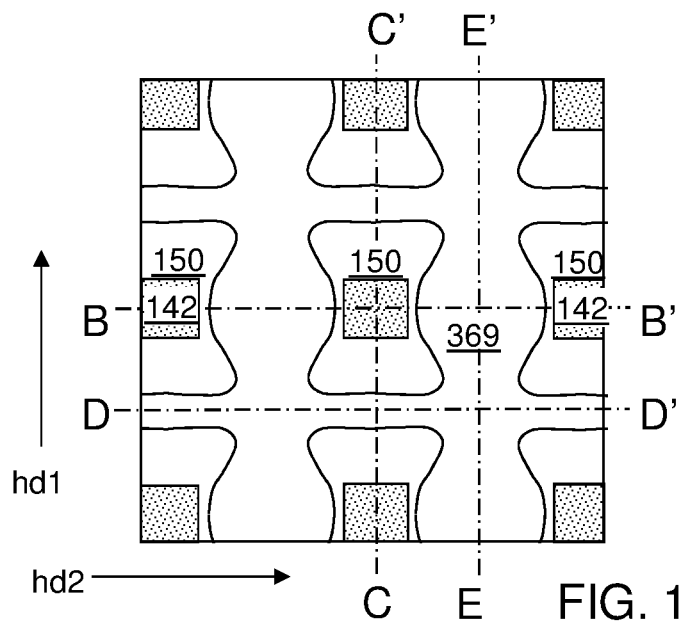
FIG. 18F
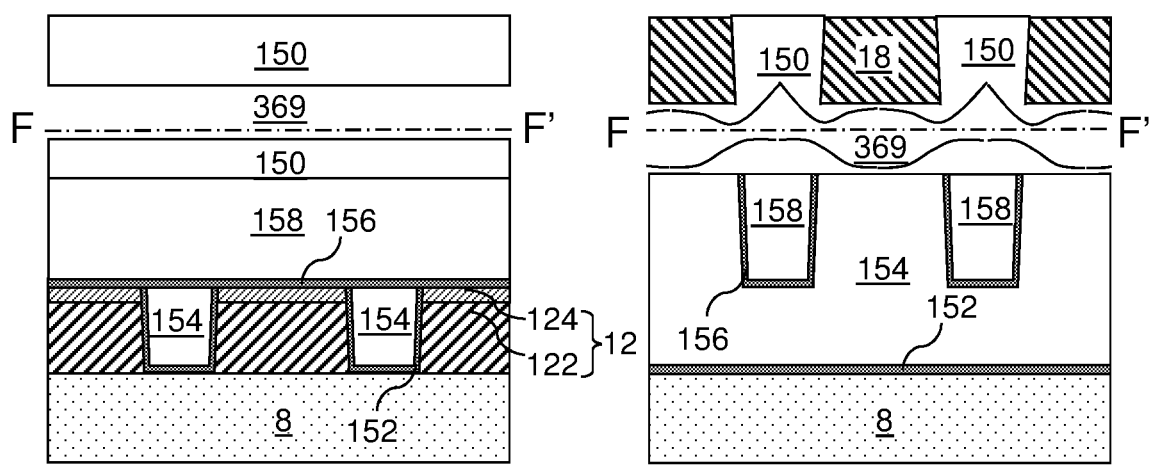
FIG. 18D
FIG. 18E

THREE-DIMENSIONAL PHASE CHANGE MEMORY DEVICE HAVING A LATERALLY CONSTRICTED ELEMENT AND METHOD OF MAKING THE SAME

FIELD

The present disclosure relates generally to the field of semiconductor devices and specifically to three-dimensional cross rail configuration phase change memory devices containing laterally constricted elements and methods of forming the same.

BACKGROUND

A phase change material (PCM) memory device is a type of non-volatile memory device that stores information as a resistive state of a material that can be in different resistive states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change memory material in a first part of a programming process. The second part of the programming process includes control of the cooling rate of the phase change memory material. If rapid quenching occurs, the phase change memory material can cool into an amorphous high resistivity state. If slow cooling occurs, the phase change memory material can cool into a crystalline low resistivity state.

SUMMARY

According to an aspect of the present disclosure, a phase change memory device is provided, which comprises: first conductive rails laterally extending along a first horizontal direction over a substrate; a rectangular array of first memory pillar structures overlying top surfaces of the first conductive rails, wherein each first memory pillar structure comprises a vertical stack of structural elements including, from one end to another, a first selector-side conductive element, a first selector element, a first selector-memory conductive element, a first phase change memory element, and a first memory-side conductive element, wherein at least one structural element within the vertical stack of structural elements is a laterally constricted structural element having laterally recessed sidewalls relative to sidewalls of a respective immediately vertically underlying structural element within the vertical stack of structural elements; and second conductive rails laterally extending along a second horizontal direction and overlying top surfaces of the rectangular array of first memory pillar structures.

According to another aspect of the present disclosure, a method of forming a phase change memory device is provided, which comprises the steps of: forming first rail stacks laterally extending along a first horizontal direction and spaced by first trenches over a substrate, wherein each of the first rail stacks comprises a first conductive rail and a first array level rail stack that includes a first selector-side conductive rail, a first selector rail, a first selector-memory conductive rail, a first phase change memory rail, and a first memory-side conductive rail; laterally recessing at least one rail within each first array level rail stack to form laterally recessed rails; forming vertical stacks of a first dielectric isolation structure and a first sacrificial rail between the first rail stacks; forming a conductive material layer over the first rail stacks; dividing the conductive material layer and the first array level rail stacks with second trenches, wherein second conductive rails and a rectangular array of first memory pillar structures are formed, and the second conductive rails laterally extend along a second horizontal direction and overlies top surfaces of the rectangular array of first memory pillar structures; removing remaining portions of the first sacrificial rails; and forming a continuous cavity-containing dielectric material portion in volumes of the second trenches and volumes formed by removal of the remaining portions of the first sacrificial rails.

BRIEF DESCRIPTION OF THE DRAWINGS

FIG. 2A is a top-down view of the first exemplary structure after formation of first rail stacks laterally spaced by first trenches by etching through the first layer stack according to an embodiment of the present disclosure.

FIG. 2B is a vertical cross-sectional view of the first exemplary structure along the vertical plane B-B' of FIG. 2A.

FIG. 2C is a vertical cross-sectional view of the first exemplary structure along the vertical plane C-C' of FIG. 2A.

FIG. 3A is a top-down view of the first exemplary structure after formation of first in-process dielectric isolation structures according to an embodiment of the present disclosure.

FIG. 3B is a vertical cross-sectional view of the first exemplary structure along the vertical plane B-B' of FIG. 3A.

FIG. 3C is a vertical cross-sectional view of the first exemplary structure along the vertical plane C-C' of FIG. 3A.

FIG. 4A is a top-down view of the first exemplary structure after formation of first dielectric isolation structures by vertically recessing the first in-process dielectric isolation structures according to an embodiment of the present disclosure.

FIG. 5A is a top-down view of the first exemplary structure after formation of laterally recessed rails by a selective isotropic trimming process according to an embodiment of the present disclosure.

FIG. 6A is a top-down view of the first exemplary structure after deposition of a sacrificial material layer according to an embodiment of the present disclosure.

FIG. 8A is a top-down view of the first exemplary structure after formation of a first top conductive layer and a patterned second photoresist layer over the first rail stacks and the first dielectric isolation structures according to an embodiment of the present disclosure.

FIG. 8B is a vertical cross-sectional view of the first exemplary structure along the vertical plane B-B' of FIG. 8A.

FIG. 8C is a vertical cross-sectional view of the first exemplary structure along the vertical plane C-C' of FIG. 8A.

FIG. 9A is a vertical cross-sectional view of the first exemplary structure after formation of second trenches through the first top conductive layer, first array level rail stacks, and the first dielectric isolation structures and formation of second lower conductive rails according to an embodiment of the present disclosure.

FIG. 9B is a vertical cross-sectional view of the first exemplary structure along the vertical plane B-B' of FIG. 9A.

FIG. 9C is a vertical cross-sectional view of the first exemplary structure along the vertical plane C-C' of FIG. 9A.

FIG. 10A is a top-down view of the first exemplary structure after formation of second in-process dielectric isolation structures according to an embodiment of the present disclosure.

FIG. 10B is a vertical cross-sectional view of the first exemplary structure along the vertical plane B-B' of FIG. 10A.

FIG. 10C is a vertical cross-sectional view of the first exemplary structure along the vertical plane C-C' of FIG. 10A.

FIG. 10D is a vertical cross-sectional view of the first exemplary structure along the vertical plane D-D' of FIG. 10A.

FIG. 10E is a vertical cross-sectional view of the first exemplary structure along the vertical plane E-E' of FIG. 10A.

FIG. 10F is a horizontal cross-sectional view of the first exemplary structure along the horizontal plane F-F' of FIGS. 10B-10E.

FIG. 11A is a top-down view of the first exemplary structure after formation of second dielectric isolation structures by vertically recessing the second in-process dielectric isolation structures and formation of an array of laterally constricted structural elements by laterally recessing structural elements formed by dividing the laterally recessed rails according to an embodiment of the present disclosure.

FIG. 11D is a vertical cross-sectional view of the first exemplary structure along the vertical plane D-D' of FIG. 11A.

FIG. 11E is a vertical cross-sectional view of the first exemplary structure along the vertical plane E-E' of FIG. 11A.

FIG. 11F is a horizontal cross-sectional view of the first exemplary structure along the horizontal plane F-F' of FIGS. 11B-11E.

FIG. 12A is a top-down view of the first exemplary structure after removal of the remaining portions of the first sacrificial rails according to an embodiment of the present disclosure.

FIG. 13A is a top-down view of the first exemplary structure after formation of a continuous cavity-containing dielectric material portion in volumes of the second trenches and volumes formed by removal of the remaining portions of the first sacrificial rails according to an embodiment of the present disclosure.

FIG. 13F is a horizontal cross-sectional view of the first exemplary structure along the horizontal plane F-F' of FIGS. 13B-13E.

FIG. 14A is a top-down view of the first exemplary structure after formation of a second-tier structure on top of a first-tier structure according to an embodiment of the present disclosure.

FIG. 14B is a vertical cross-sectional view of the first exemplary structure along the vertical plane B-B' of FIG. 14A.

FIG. 14C is a vertical cross-sectional view of the first exemplary structure along the vertical plane C-C' of FIG. 14A.

FIG. 15A is a top-down view of a second exemplary structure after formation of a continuous cavity-containing dielectric material portion in volumes of the second trenches and volumes formed by removal of the remaining portions of the first sacrificial rails according to an embodiment of the present disclosure.

FIG. 15B is a vertical cross-sectional view of the second exemplary structure along the vertical plane B-B' of FIG. 15A.

FIG. 15C is a vertical cross-sectional view of the second exemplary structure along the vertical plane C-C' of FIG. 15A.

FIG. 15D is a vertical cross-sectional view of the second exemplary structure along the vertical plane D-D' of FIG. 15A.

FIG. 15E is a vertical cross-sectional view of the second exemplary structure along the vertical plane E-E' of FIG. 15A.

FIG. 15F is a horizontal cross-sectional view of the second exemplary structure along the horizontal plane F-F' of FIGS. 15B-15E.

FIG. 16A is a top-down view of a third exemplary structure after formation of a continuous cavity-containing dielectric material portion in volumes of the second trenches and volumes formed by removal of the remaining portions of the first sacrificial rails according to an embodiment of the present disclosure.

FIG. 16B is a vertical cross-sectional view of the third exemplary structure along the vertical plane B-B' of FIG. 16A.

FIG. 16C is a vertical cross-sectional view of the third exemplary structure along the vertical plane C-C' of FIG. 16A.

FIG. 16D is a vertical cross-sectional view of the third exemplary structure along the vertical plane D-D' of FIG. 16A.

FIG. 16E is a vertical cross-sectional view of the third exemplary structure along the vertical plane E-E' of FIG. 16A.

FIG. 16F is a horizontal cross-sectional view of the third exemplary structure along the horizontal plane F-F' of FIGS. 16B-16E.

FIG. 17A is a top-down view of a fourth exemplary structure after formation of a continuous cavity-containing dielectric material portion in volumes of the second trenches and volumes formed by removal of the remaining portions of the first sacrificial rails according to an embodiment of the present disclosure.

FIG. 17D is a vertical cross-sectional view of the fourth exemplary structure along the vertical plane D-D' of FIG. 17A.

FIG. 17E is a vertical cross-sectional view of the fourth exemplary structure along the vertical plane E-E' of FIG. 17A.

FIG. 17F is a horizontal cross-sectional view of the fourth exemplary structure along the horizontal plane F-F' of FIGS. 17B-17E.

FIG. 18A is a top-down view of a fifth exemplary structure after formation of a continuous cavity-containing dielectric material portion in volumes of the second trenches and volumes formed by removal of the remaining portions of the first sacrificial rails according to an embodiment of the present disclosure.

FIG. 18D is a vertical cross-sectional view of the fifth exemplary structure along the vertical plane D-D' of FIG. 18A.

FIG. 18E is a vertical cross-sectional view of the fifth exemplary structure along the vertical plane E-E' of FIG. 18A.

FIG. 18F is a horizontal cross-sectional view of the fifth exemplary structure along the horizontal plane F-F' of FIGS. 18B-18E.

DETAILED DESCRIPTION

Figure 1A:
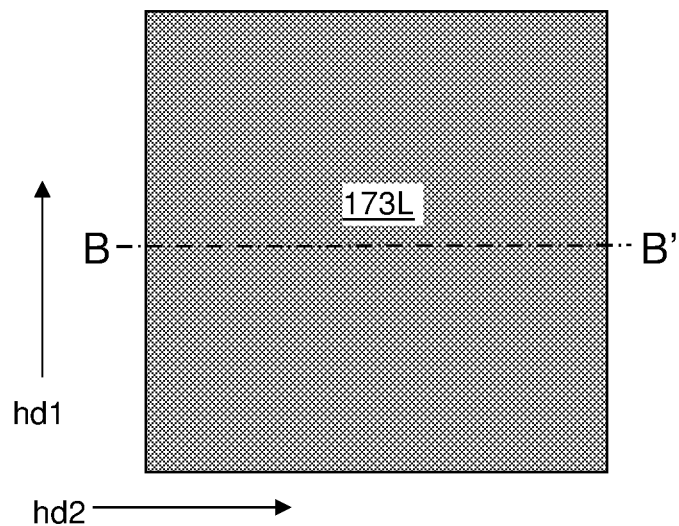
FIG. 1A is a top-down view of a first exemplary structure for forming a three-dimensional phase change memory device after formation of a first layer stack including a first bottom conductive layer, a first selector-side conductive layer, a first selector material layer, a first selector-memory conductive layer, a first phase change memory layer, and a first memory-side conductive layer according to an embodiment of the present disclosure.

The present inventors realized that prior art PCM devices require a higher than desired reset current during a reset operation, and suffer from a proximity thermal disturb (cross-talk) problem between horizontally adjacent memory cells during the reset operation. Embodiments of the present disclosure provide a PCM device that includes a laterally constricted structural element having recessed sidewalls (e.g., a bottle neck type shaped element). The laterally constricted structural element permits the use of a lower reset current and voltage during the reset operation, because the current density is increased at the laterally constricted structural element (e.g., at the upper electrode) due to its recessed shape. The higher density current flows to the interface between upper electrode and the phase change material of the memory cell, heating up the phase change material at the interface, and changing the crystal structure of the phase change material in the memory cell from crystalline to amorphous during the reset operation.

In one embodiment, the entire phase change material layer in each memory cell does not have to undergo a phase transition. In contrast, only a mushroom shaped upper part of the phase change material layer around the interface with the upper electrode can be converted from crystalline to amorphous state during the reset operation to reset the entire memory cell. Therefore, a high reset voltage and current are not required to elevate temperature of the whole memory cell, but a lower reset voltage and current can be used to melt the phase change material layer part near its boundary with the upper electrode to reset the memory cell. Therefore, the voltage for reset ($V_{reset}$) and the current for reset ($I_{reset}$) can be reduced. In another embodiment, an air gap can be provided next to the boundary between upper electrode and phase change material layer of the laterally adjacent memory cells. The air gap helps confine the thermal energy during the reset operation and reduce heat transfer between the laterally adjacent memory cells because of a lower thermal conductivity of air compared to silicon oxide insulating material located between adjacent memory cells in the prior art structure. This air gap embodiment structure provides less program disturb effect than the prior art structure which lacks an air gap.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow. As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 1B:
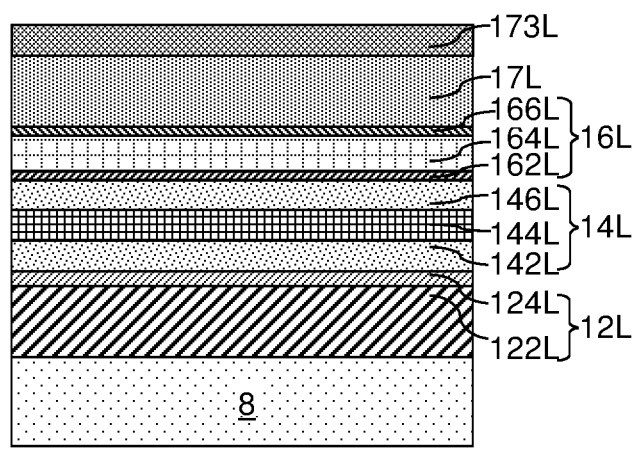
FIG. 1B is a vertical cross-sectional view of the first exemplary structure along the vertical plane B-B' of FIG. 1A.

Referring to FIGS. 1A and 1B, an exemplary structure for forming a three-dimensional phase change memory device is illustrated, which includes a substrate 8. The substrate 8 includes an insulating material layer in an upper portion, and may optionally include additional layers (not illustrated) underneath, which can include, for example, a semiconductor material layer and interconnect level dielectric layers embedding metal interconnect structures therein. In one embodiment, semiconductor devices such as field effect transistors may be provided on the semiconductor material layer, and the metal interconnect structures can provide electrically conductive paths among the semiconductor devices. The exemplary structure includes a memory array region, which is illustrated herein, and a peripheral region (not illustrated) including interconnect structures and/or peripheral devices. Memory cells are subsequently formed in the memory array region.

A first vertical stack (12L, 14L, 16L, 17L, 173L), which is also referred to as a first layer stack, is formed over the substrate 8. The first vertical stack (12L, 14L, 16L, 17L, 173L) can include a first bottom conductive layer 12L, a first selector layer stack 14L, a first phase change memory layer 16L, a first memory-side conductive layer 17L, and an optional first hard mask layer 173L. Each layer in the first vertical stack (12L, 14L, 16L, 17L, 173L) can be formed as a blanket material layer, i.e., an unpatterned material layer that laterally extend along a first horizontal direction hd1 and a second horizontal direction hd2 that is perpendicular to the first horizontal direction hd1.

The first bottom conductive layer 12L includes at least one conductive material layer, which can be at least one metallic material layer. For example, the first bottom conductive layer 12L can include a layer stack, from bottom to top, of a first metal layer 122L (such as a tungsten layer) and a first metal nitride layer 124L (such as a tungsten nitride layer or a titanium nitride layer). The thickness of the first metal layer 122L can be in a range from 20 nm to 100 nm, such as from 30 nm to 70 nm, although lesser and greater thicknesses can also be employed. The thickness of the first metal nitride layer 124L can be in a range from 1 nm to 10 nm, such as from 1.5 nm to 5 nm, although lesser and greater thicknesses can also be employed.

The first selector layer stack 14L includes a first selector material layer 144L. The first selector material layer includes at least a layer of a non-Ohmic material. The non-Ohmic material provides electrical connection or electrical isolation depending on the magnitude and/or the polarity of an externally applied voltage bias thereacross. In one embodiment, the first selector material layer 144L including an ovonic threshold switch material (OTS material). The OTS material can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is removed. Throughout the resistive state changes, the ovonic threshold switch material can remain non-crystalline (e.g., amorphous). In one embodiment, the ovonic threshold switch material can comprise layer a chalcogenide material which exhibits hysteresis in both the write and read states. The chalcogenide material may be a GeTe compound or a Ge—Se compound doped with a dopant selected from As, N, C, and Si, such as a Ge—Se—As compound semiconductor material. The selector material layer can include a first selector material layer 144L which contains any ovonic threshold switch material. In one embodiment, the first selector material layer 144L can include, and/or can consist essentially of, a GeSeAs alloy, a GeSe alloy, a SeAs alloy, a GeTe alloy, or a SiTe alloy. In another embodiment, the ovonic threshold switch material can be doped with trace amounts of rare-earth metals. In one embodiment, the material of the first selector material layer 144L can be selected such that the resistivity of the first selector material layer 144L decreases at least by two orders of magnitude (i.e., by more than a factor of 100) upon application of an external bias voltage that exceeds a critical bias voltage magnitude. In one embodiment, the composition and the thickness of the first selector material layer 144L can be selected such that the critical bias voltage magnitude can be in a range from 1 V to 4 V, although lesser and greater voltages can also be employed for the critical bias voltage magnitude. The thickness of the first selector material layer 144L can be, for example, in a range from 5 nm to 50 nm, such as from 10 nm to 30 nm, although lesser and greater thicknesses can also be employed.

The first selector layer stack 14L can further include a first selector-memory conductive layer 146L overlying the first selector material layer 144L and a first selector-side conductive layer 142L underlying the first selector material layer 144L. The first selector-memory conductive layer 146L and the first selector-side conductive layer 142L can include a conductive material. For example, the first selector-memory conductive layer 146L and the first selector-side conductive layer 142L can include amorphous carbon, diamond-like carbon (DLC), or tungsten. In one embodiment, the first selector-memory conductive layers 146L can include an upper amorphous carbon layer that contacts a top surface of the first selector material layer 144L, and the first selector-side conductive layer 142L can include a lower amorphous carbon layer that contacts a bottom surface of the first selector material layer 144L. The thickness of the first selector-memory conductive layers 146L can be in a range from 4 nm to 40 nm, such as from 8 nm to 20 nm, although lesser and greater thicknesses can also be employed. The thickness of the first selector-side conductive layer 142L can be in a range from 4 nm to 40 nm, such as from 8 nm to 20 nm, although lesser and greater thicknesses can also be employed.

Alternatively or additionally, the first selector layer stack 14L may include an alternative non-Ohmic material layer such as a p-n junction diode layer. In this case, the first selector layer stack 14L becomes conductive only under electrical bias condition of one polarity, and becomes electrically non-conductive under electrical bias condition of the opposite polarity. In general, the first selector layer stack 14L will be subsequently patterned to form a selector element that provides non-linear voltage-current characteristics such that the element functions as a conductor under first voltage bias conditions and as an insulator under second voltage bias conditions.

The first phase change memory layer 16L includes a first phase change memory material layer 164L. The first phase change memory material layer 164L include a phase change memory material. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state.

Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change memory material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the first phase change memory material layer 164L can be in a range from 1 nm to 60 nm, such as from 3 nm to 40 nm and/or from 10 nm to 25 nm, although lesser and greater thicknesses can also be employed.

The first phase change memory layer 16L can optionally include a first lower barrier liner layer 162L underlying the first phase change memory material layer 164L, and can optionally include a first upper barrier liner layer 166L overlying the first phase change memory material layer 164L. The optional first lower barrier liner layer 162L and/or the optional first upper barrier liner layer 166L, if present, include a material that suppresses diffusion of the material of the first phase change memory material layer 164L. In one embodiment, the first lower barrier liner layer 162L and/or the first upper barrier liner layer 166L can include a conductive metallic nitride such as titanium nitride, tantalum nitride, or tungsten nitride. The thickness of each of the first lower barrier liner layer 162L and the first upper barrier liner layer 166L can be in a range from 1 nm to 10 nm, such as from 1.5 nm to 5 nm, although lesser and greater thicknesses can also be employed.

The first memory-side conductive layer 17L, if present, includes a conductive material such as amorphous carbon, diamond-like carbon (DLC), or tungsten, and can be formed on top of the first phase change memory layer 16L. The conductive material can include, and/or can consist essentially of, amorphous carbon. The thickness of each first memory-side conductive layer 17L can be in a range from 20 nm to 100 nm, such as from 30 nm to 80 nm, although lesser and grater thicknesses can also be employed.

The first hard mask layer 173L includes a hard mask material that can be employed as a planarization stopping structure in a subsequent planarization process. The first hard mask layer 173L can include a material selected from a metal, a dielectric material, or a semiconductor material. For example, the first hard mask layer 173L can include silicon nitride, a dielectric metal oxide, or a metal. In one embodiment, the first hard mask layer 173L can include silicon nitride. The thickness of the first hard mask layer 173L can be in a range from 3 nm to 30 nm, such as from 6 nm to 15 nm, although lesser and greater thicknesses can also be employed.

Referring to FIGS. 2A-2C, a first photoresist layer 197 can be applied over the first vertical stack (12L, 14L, 16L, 17L, 173L), and can be lithographically patterned to form a line and space pattern. For example, the first photoresist layer 197 can be patterned to form line trenches that laterally extend along the first horizontal direction hd1 and laterally spaced apart along the second horizontal direction hd2. The line trenches can have a uniform width that is invariant with translation along the first horizontal direction hd1. The pattern in the first photoresist layer 197 can be a periodic pattern that is repeated along the second horizontal direction hd2 with a pitch that is equal to the sum of the width of a line trench in the first photoresist layer 197 and the width of a patterned portion of the first photoresist layer 197. The pitch can be in a range from 32 nm to 600 nm, although lesser and greater pitches can also be employed.

An anisotropic etch process is performed employing the patterned portions of the first photoresist layer 197 as an etch mask. The anisotropic etch process etches through portions of the first vertical stack (12L, 14L, 16L, 17L, 173L) that are not masked by the first photoresist layer 197. The chemistry of the anisotropic etch process can be sequentially modified to etch through the various material layers of the first vertical stack (12L, 14L, 16L, 17L, 173L). The anisotropic etch process can stop at, or below, the top surface of the substrate 8. First trenches 11 laterally extending along the first horizontal direction hd1 are formed by the anisotropic etch. The first trenches 11 can be line trenches having a uniform vertical cross-sectional shape within vertical planes that are perpendicular to the first horizontal direction hd1. The uniform vertical cross-sectional shape of each first trench 11 can be invariant with translation along the first horizontal direction hd1. Each first trench 11 can vertically extend from the horizontal plane including the bottom surface of the first photoresist layer 197 to the horizontal plane including the top surface of the substrate 8. Each first trench 11 can have a vertical cross-sectional shape of an inverted trapezoid.

Remaining portions of the first vertical stack (12L, 14L, 16L, 17L, 173L) include first rail stacks (12, 14', 16', 17', 173'), each of which laterally extends along the first horizontal direction hd1. The first rail stacks (12, 14', 16', 17', 173') are laterally spaced apart by the first trenches 11 along the second horizontal direction hd2. As used herein, a "rail" or a "rail structure" refers to a structure that extends along a lengthwise direction with a uniform cross-sectional shape within planes that are perpendicular to the lengthwise direction that is invariant under translation along the lengthwise direction. As used herein, a "stacked rail" or a "rail stack" refers to a contiguous stack of at least two rails that laterally extend along a same lengthwise direction.

Each first rail stack (12, 14', 16', 17', 173') includes, from bottom to top, a first conductive rail 12 that is a patterned portion of the first bottom conductive layer 12L, a first selector rail 14' that is a patterned portion of the first selector layer 14L, a first phase change memory rail 16' that is a patterned portion of the first phase change memory layer 16L, a first memory-side conductive rail 17' that is a patterned portion of the first memory-side conductive layer 17L, and an optional first hard mask strip 173' that is a patterned portion of the first hard mask layer 173L. As used herein, a "strip" refers to a rail having a thickness that is less than the width. The first rail stacks (12, 14', 16', 17', 173') laterally extend along the first horizontal direction hd1, are laterally spaced among one another by the first trenches 11, and are located over the substrate 8.

In one embodiment, each of the first conductive rails 12 can include a vertical stack of a first metal rail 122 that is a patterned portion of the first metal layer 122L and a first metal nitride strip 124 that is a patterned portion of the first metal nitride layer 124L. In one embodiment, each first selector rail 14' can include a vertical stack of a first selector-side conductive rail 142', a first selector rail 144', and a first selector-memory conductive rail 146'. The first selector-side conductive rail 142' is a patterned portion of a first selector-side conductive layer 142L. The first selector rail 144' is a patterned portion of the first selector material layer 144L. The first selector-memory conductive rail 146' is a patterned portion of the first selector-memory conductive layer 146L. In one embodiment, each first phase change memory rail 16' can include, from bottom to top, a first optional lower barrier liner strip 162', a first phase change memory material rail 164', and a first optional upper barrier liner strip 166'. Each first lower barrier liner strip 162' is a patterned portion of the first lower barrier liner layer 162L, each first phase change memory material rail 164' is a patterned portion of the first phase change memory material layer 164L, and each first upper barrier liner strip 166' is a patterned portion of the first upper barrier liner layer 166L. The first photoresist layer 197 can be subsequently removed, for example, by ashing. The first rail stacks (12, 14', 16', 17', 173') laterally extend along the first horizontal direction hd1, and are laterally spaced among one another by the first trenches 11 over the substrate 8.

Each first rail stacks (12, 14', 16', 17', 173') includes a vertical stack of a first conductive rail 12 and a first array level rail stack (14', 16', 17', 173'). Each first array level rail stack (14', 16', 17', 173') comprises a first selector rail 14', a first phase change memory rail 16', a first memory-side conductive rail 17', and an optional first hard mask strip 173'.

Referring to FIGS. 3A-3C, a first continuous dielectric liner layer can be optionally deposited on sidewalls and bottom surfaces of the first trenches 11 and over the first hard mask strips 173'. The first continuous dielectric liner layer includes a dielectric material such as silicon nitride, a dielectric metal oxide (such as aluminum oxide), or silicon oxide. The first continuous dielectric liner layer can be deposited by a conformal deposition method such as chemical vapor deposition (CVD) or atomic layer deposition (ALD). The thickness of the first continuous dielectric liner layer can be in a range from 1 nm to 10 nm, such as from 2 nm to 6 nm, although lesser and greater thicknesses can also be employed. The first continuous dielectric liner layer includes a material different from the material of the first memory-side conductive rails 17'.

A first dielectric fill material layer can be deposited on the first continuous dielectric liner layer. The first dielectric fill material layer includes a planarizable dielectric material such as undoped silicate glass (e.g., silicon oxide), doped silicate glass, or a spin-on glass (SOG). The first dielectric fill material layer can be deposited by a conformal deposition method or by a self-planarizing deposition method (such as spin coating). In one embodiment, the first continuous dielectric liner layer can include, and/or can consist essentially of, a material selected from silicon nitride and a dielectric metal oxide, and the first dielectric fill material layer can include, and/or can consist essentially of, a material selected from doped silicate glass and undoped silicate glass.

Portions of the first continuous dielectric liner layer and the first dielectric fill material layer can be removed from above the horizontal plane including top surfaces of the first hard mask strips 173' by a planarization process. The planarization process can include chemical mechanical planarization (CMP) and/or a recess etch process. Each remaining portion of the first continuous dielectric liner layer constitutes a first in-process dielectric liner 152', and each remaining portion of the first dielectric fill material layer constitutes a first in-process dielectric fill material portion 154'. Each contiguous set of a first in-process dielectric liner 152' and a first in-process dielectric fill material portion 154' constitutes a first in-process dielectric isolation structure (152', 154'), which is a dielectric isolation structure having a shape of a rail. A first in-process dielectric isolation structure (152', 154') is formed in each of the first trenches 11 as a rail structure. The first in-process dielectric isolation structures (152', 154') laterally extend along the first horizontal direction hd1, and are laterally spaced among one another along the second horizontal direction hd2. The top surfaces of the first in-process dielectric isolation structures (152', 154') can be coplanar with the top surfaces of the first hard mask strips 173'.

If the first hard mask strips 173' are present, top surfaces of the first in-process dielectric isolation structures (152', 154') can be recessed by an etch process, which can be an isotropic etch process or an anisotropic etch process. The duration of the etch process can be selected such that the recessed top surfaces of the first in-process dielectric isolation structures (152', 154') is at about the level of the top surfaces of the first memory-side conductive rails 17'. The first hard mask strips 173' can be subsequently removed. For example, if the first hard mask strips 173' include silicon nitride, the first hard mask strips 173' can be removed by a wet etch employing hot phosphoric acid.

Figure 4B:
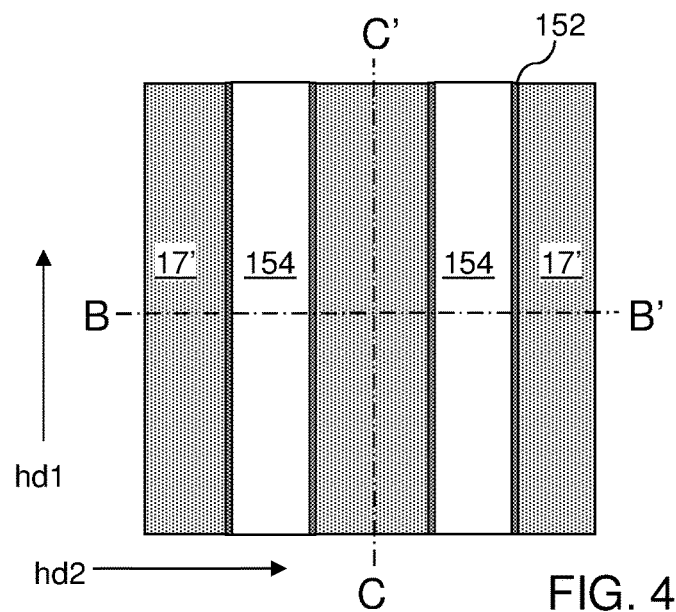
FIG. 4B is a vertical cross-sectional view of the first exemplary structure along the vertical plane B-B' of FIG. 4A.
Figure 4C:
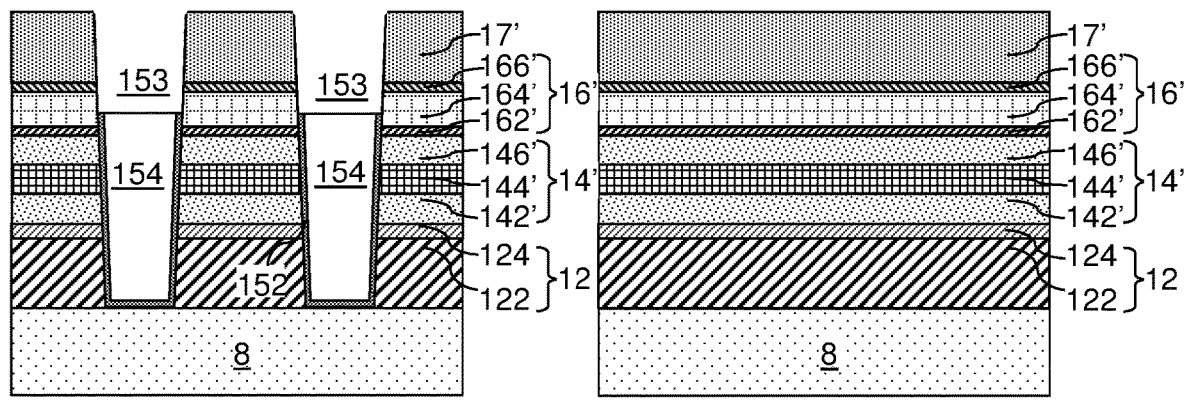
FIG. 4C is a vertical cross-sectional view of the first exemplary structure along the vertical plane C-C' of FIG. 4A.

Referring to FIGS. 4A-4C, an isotropic recess etch can be performed to vertically recess top surfaces of the first in-process dielectric fill material portions 154'. For example, if the first in-process dielectric fill material portions 154' include silicon oxide, a timed wet etch employing dilute hydrofluoric acid can be employed to vertically recess top surfaces of the first in-process dielectric fill material portions 154' below a horizontal plane including bottom surfaces of the first memory-side conductive rails 17'. The remaining portions of the first in-process dielectric fill material portions 154' are herein referred to as first dielectric fill material portions 154. The duration of the isotropic recess etch process can be selected so that top surfaces of the first dielectric fill material portions 154 are formed above the horizontal plane including top surfaces of the first selector-memory conductive rails 146'.

Physically exposed portions of the first in-process dielectric liners 152' can be removed by an isotropic etch process. If the first in-process dielectric liners 152' include silicon nitride, a wet etch process employing hot phosphoric acid can be performed to remove the physically exposed portions of the first in-process dielectric liners 152'. Each remaining portion of the first in-process dielectric liners 152' constitutes a first dielectric liner 152. Each contiguous combination of a first dielectric liner 152 and a first dielectric fill material portion 154 constitutes a first dielectric isolation structure (152, 154). First line cavities 153 can be formed above the first dielectric isolation structures (152, 154).

Figure 5B:
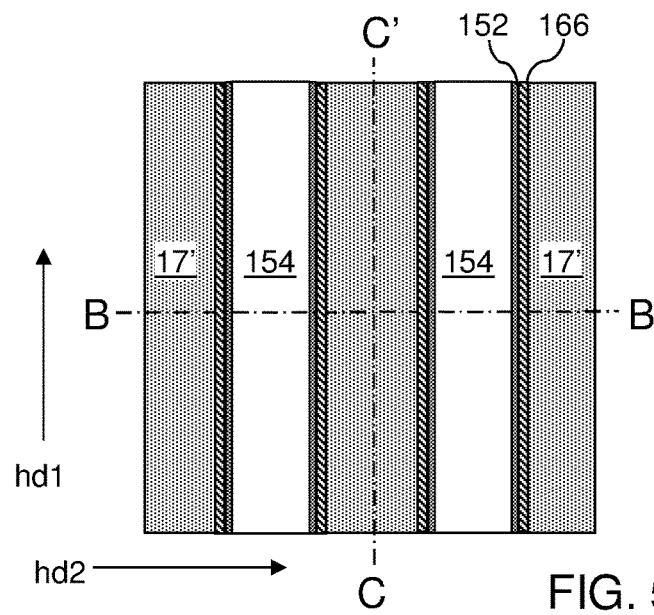
FIG. 5B is a vertical cross-sectional view of the first exemplary structure along the vertical plane B-B' of FIG. 5A.
Figure 5C:
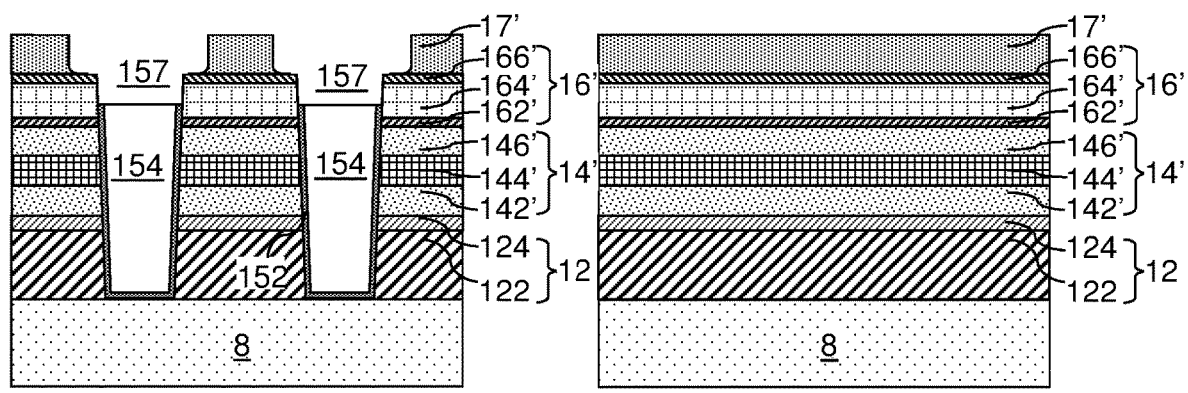
FIG. 5C is a vertical cross-sectional view of the first exemplary structure along the vertical plane C-C' of FIG. 5A.

Referring to FIGS. 5A-5C, a selective isotropic trimming process can be performed to trim the material of the first memory-side conductive rails 17' without significantly removing materials of the first phase change memory rails 16' and the first dielectric isolation structures (152, 154). The first memory-side conductive rails 17' are thinned and laterally recessed by the selective isotropic trimming process. For example, the selective isotropic trimming process can include a plasma etch process or a wet etch process. The recess distance of the selective isotropic trimming process can be in a range from 10 nm to 50 nm, although lesser and greater recess distances can also be employed. The first memory-side conductive rails 17' as laterally recessed and vertically thinned constitute laterally recessed rails, i.e., rails that are laterally recessed relative to a respective underlying rail such as a first phase change memory rail 16'. A first cavity 157 including a laterally expanded region is formed above each first dielectric isolation structure (152, 154).

Figure 6B:
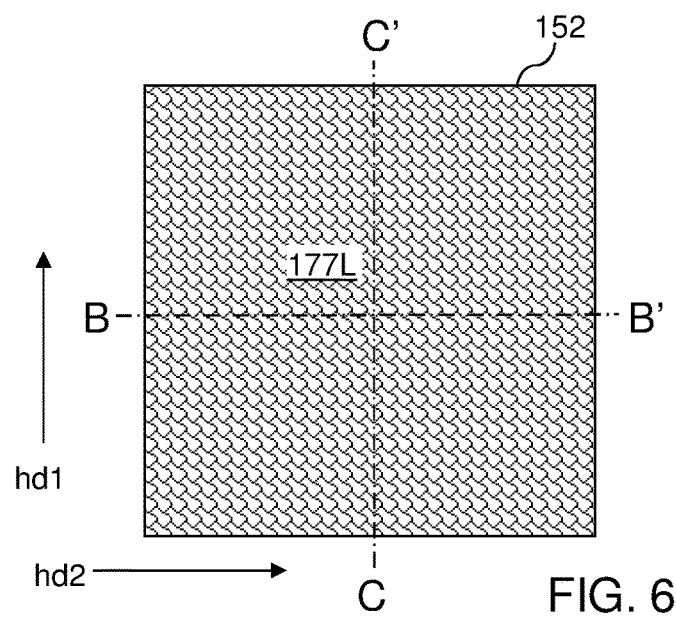
FIG. 6B is a vertical cross-sectional view of the first exemplary structure along the vertical plane B-B' of FIG. 6A.
Figure 6C:
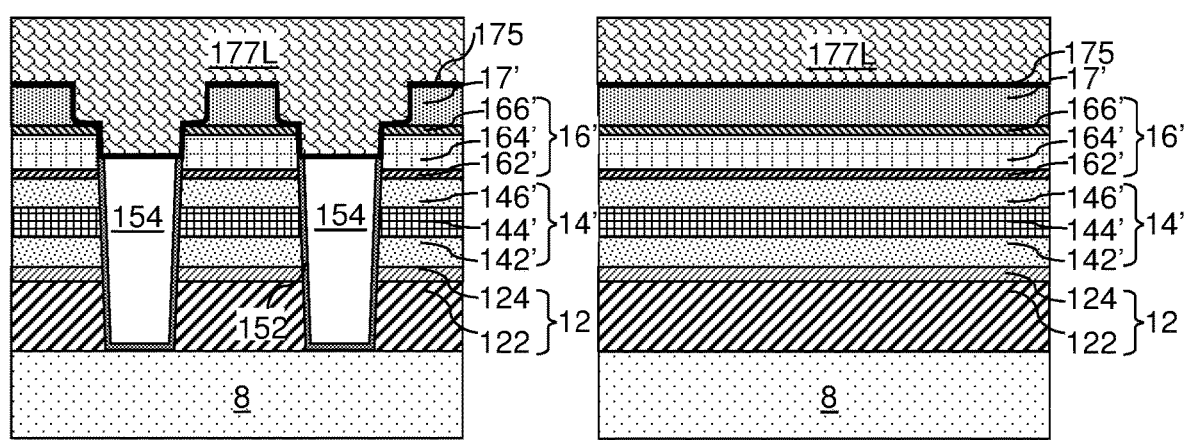
FIG. 6C is a vertical cross-sectional view of the first exemplary structure along the vertical plane C-C' of FIG. 6A.

Referring to FIGS. 6A-6C, a sacrificial liner 175 can be deposited by a conformal deposition process. The sacrificial liner 175 includes a material that is different from the material of the first dielectric fill material portions 154. In one embodiment, the sacrificial liner 175 includes a dielectric material such as silicon nitride and/or a dielectric metal nitride.

A sacrificial material layer 177L is formed over the sacrificial liner 175 to fill the first stepped cavities 157. The sacrificial material layer 157L includes a sacrificial material that can be subsequently removed selective to the sacrificial liner 175. In one embodiment, the sacrificial material layer 177L includes a semiconductor material such as amorphous silicon, polysilicon, or a silicon-germanium alloy.

Figure 7A:
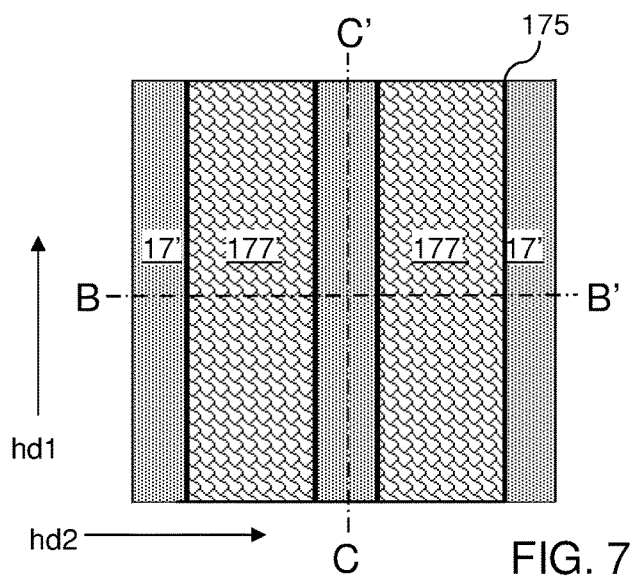
FIG. 7A is a top-down view of the first exemplary structure after formation of first sacrificial rails in upper portions of the second trenches according to an embodiment of the present disclosure.
Figures 7B, 7C:
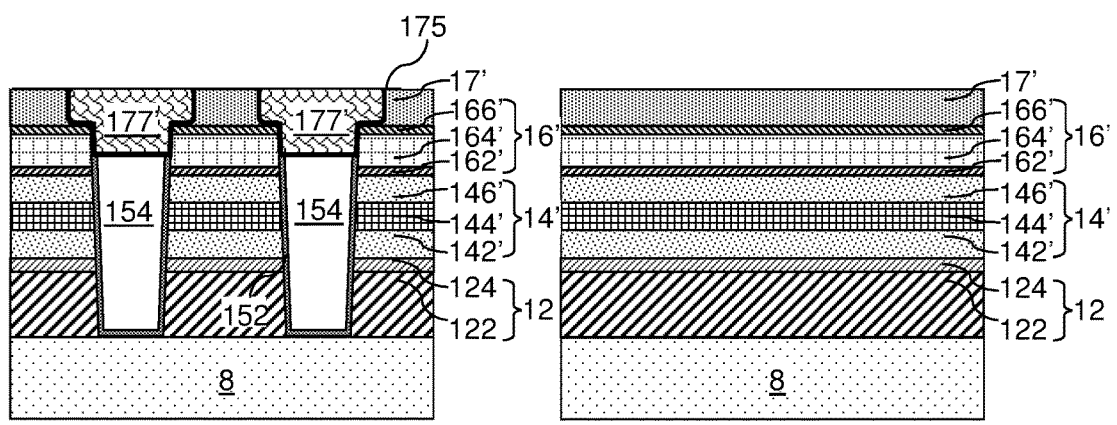
FIG. 7B is a vertical cross-sectional view of the first exemplary structure along the vertical plane B-B' of FIG. 7A.
FIG. 7C is a vertical cross-sectional view of the first exemplary structure along the vertical plane C-C' of FIG. 7A.
Figure 11B:
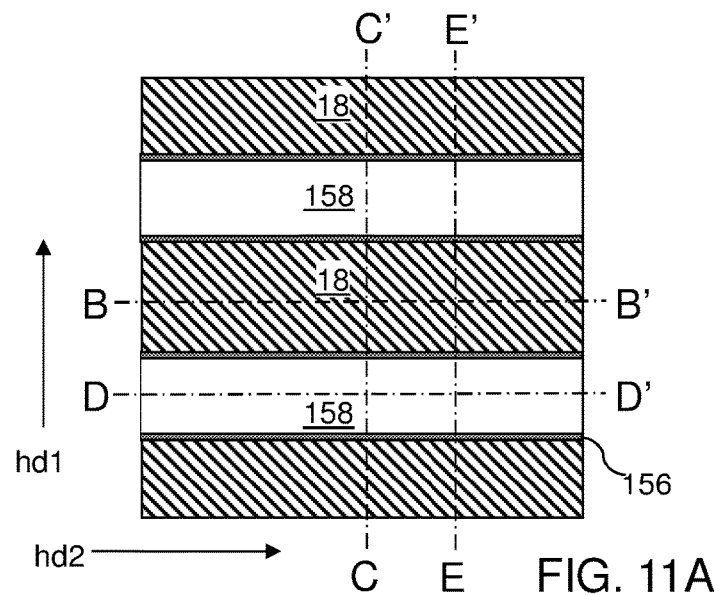
FIG. 11B is a vertical cross-sectional view of the first exemplary structure along the vertical plane B-B' of FIG. 11A.
Figure 11C:
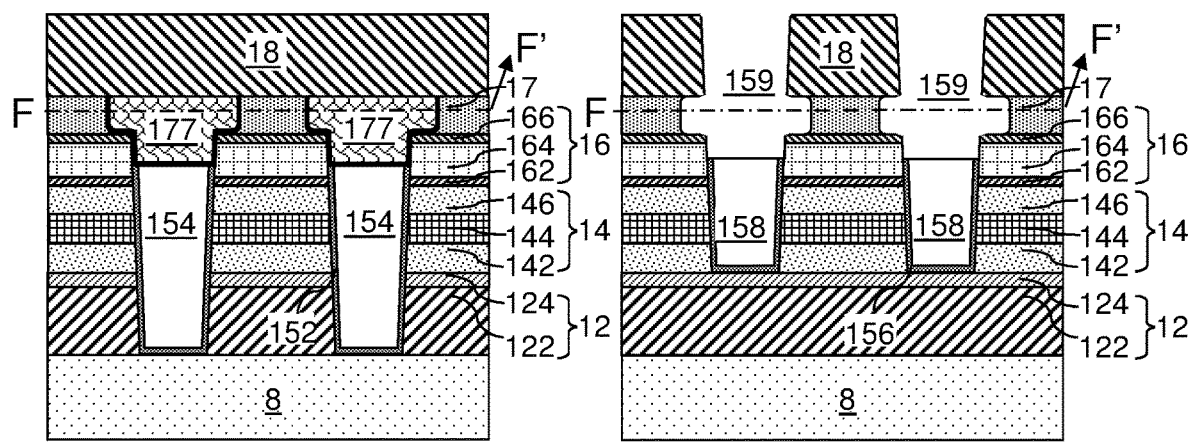
FIG. 11C is a vertical cross-sectional view of the first exemplary structure along the vertical plane C-C' of FIG. 11A.
Figure 12B:
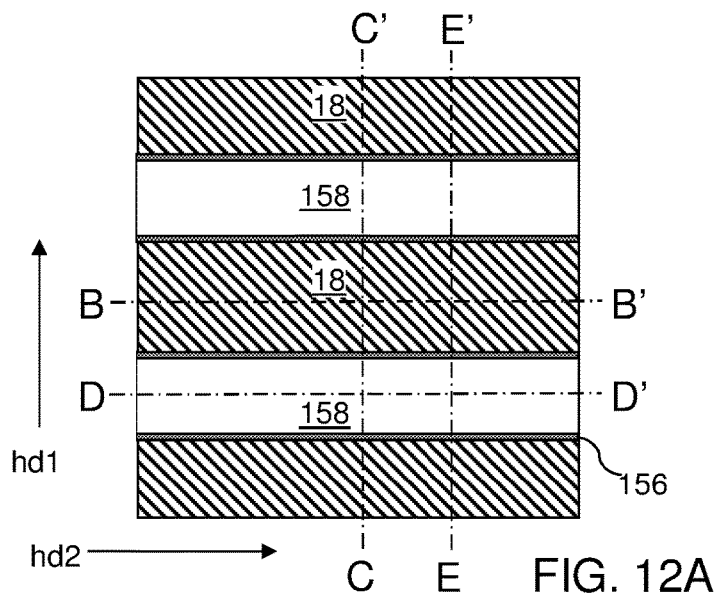
FIG. 12B is a vertical cross-sectional view of the first exemplary structure along the vertical plane B-B' of FIG. 12A.
Figure 12C:
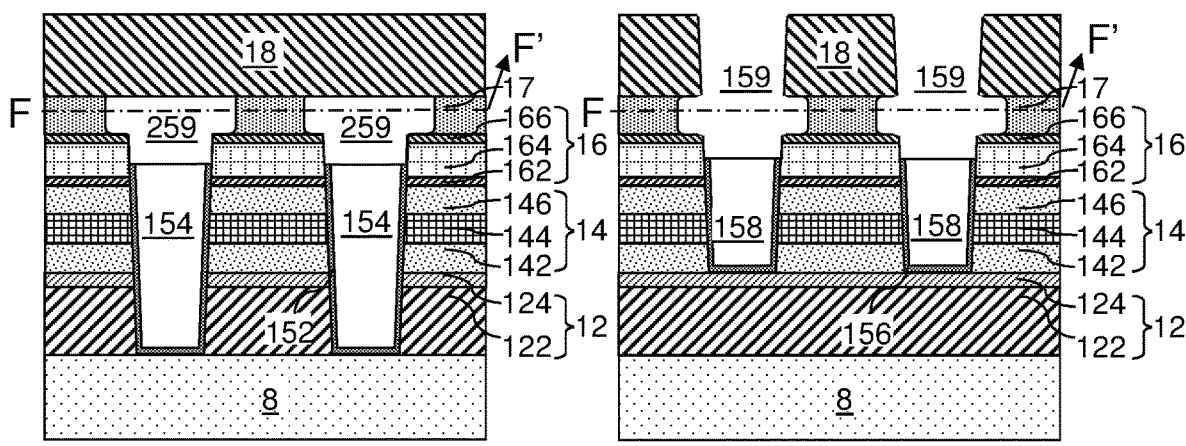
FIG. 12C is a vertical cross-sectional view of the first exemplary structure along the vertical plane C-C' of FIG. 12A.
Figure 12F:
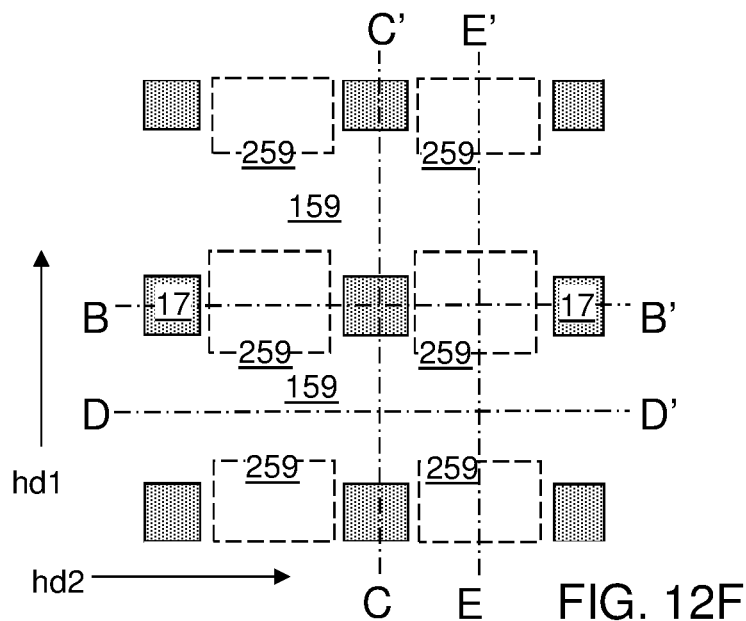
FIG. 12F is a horizontal cross-sectional view of the first exemplary structure along the horizontal plane F-F' of FIGS. 12B-12E.
Figure 12D:
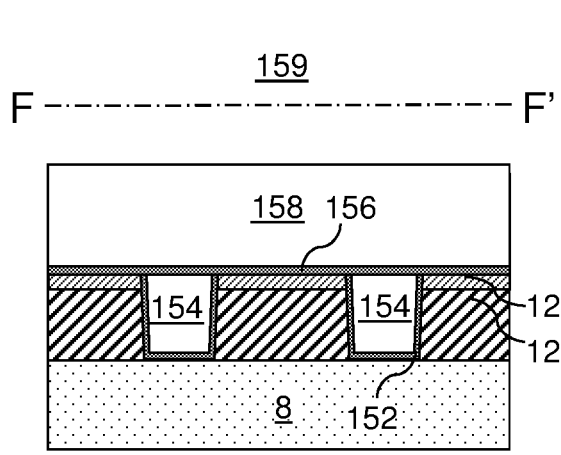
FIG. 12D is a vertical cross-sectional view of the first exemplary structure along the vertical plane D-D' of FIG. 12A.
Figure 12E:
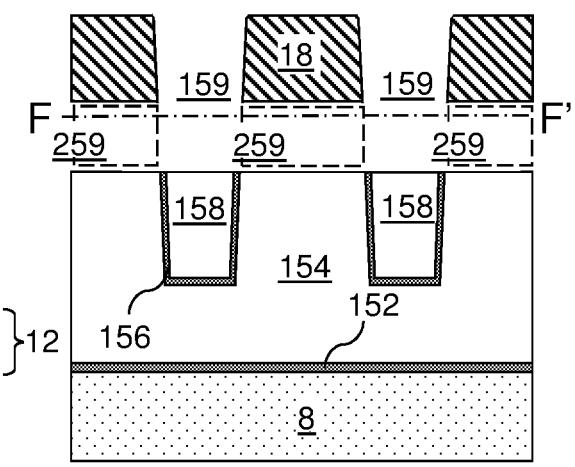
FIG. 12E is a vertical cross-sectional view of the first exemplary structure along the vertical plane E-E' of FIG. 12A.

Referring to FIGS. 7A-7C, a planarization process can be performed to remove portions of the sacrificial material layer 177L and the sacrificial liner 175 from above the horizontal plane including top surfaces of the first memory-side conductive rails 17'. Each remaining portion of the sacrificial material layer 177L constitutes a first sacrificial rail 177'. Each first sacrificial rail 177' is spaced from the first array level rails (14', 16', 17') and from the first dielectric isolation structures (152, 154) by a sacrificial liner 175.

Referring to FIGS. 8A-8C, a first top conductive layer 18L can be formed over the one-dimensional array of first rail stacks (12, 14', 16', 17') spaced by the first dielectric isolation structures (152, 154). The first top conductive layer 18L includes at least one conductive material layer, which can be at least one metallic material layer. For example, the first top conductive layer 18L can include a metal layer (such as a tungsten layer). The thickness of the first top conductive layer 18L can be in a range from 20 nm to 100 nm, such as from 30 nm to 70 nm, although lesser and greater thicknesses can also be employed. The thickness of the first top conductive layer 18L can be in a range from 1 nm to 10 nm, such as from 1.5 nm to 5 nm, although lesser and greater thicknesses can also be employed.

A first etch mask layer 198 can be formed over the first top conductive layer 18L. The first etch mask layer 198 includes a hard mask material such as silicon nitride or silicon oxide. A second photoresist layer 199 having a line and space pattern can be formed over the first top conductive layer 18L. Portions of the second photoresist layer 199 laterally extend along the second horizontal direction hd2 with a respective uniform width. Thus, line trenches are present among the portions of the second photoresist layer 199. The line trenches laterally extend along the second horizontal direction hd2, and are laterally spaced apart along the first horizontal direction hd1. The line trenches can have a uniform width that is invariant with translation along the second horizontal direction hd2. The pattern in the second photoresist layer 199 can be a periodic pattern that is repeated along the first horizontal direction hd1 with a pitch that is equal to the sum of the width of a line trench in the second photoresist layer 199 and the width of a patterned line-shaped portion of the second photoresist layer 199. The pitch can be in a range from 32 nm to 600 nm, although lesser and greater pitches can also be employed. An anisotropic etch process can be performed to transfer the pattern in the second photoresist layer 199 through the first etch mask layer 198.

Referring to FIGS. 9A-9C, second trenches 15 are formed through the first top conductive layer 18L, the first array level rails (14', 16', 17'), and the first dielectric isolation structures (152, 154). An anisotropic etch process can be performed to etch portions of the first top conductive layer 18L, the first array level rails (14', 16', 17'), and the first dielectric isolation structures (152, 154) that are not masked by the second photoresist layer 199. The chemistry of the anisotropic etch process can be sequentially modified to etch through the various materials of the first top conductive layer 18L, the first array level rails (14', 16', 17'), and the first dielectric isolation structures (152, 154). Volumes from which the materials of the first top conductive layer 18L, the first array level rails (14', 16', 17'), and the first dielectric isolation structures (152, 154) are removed constitute the second trenches 15. The second trenches 15 laterally extend along the second horizontal direction hd2.

The anisotropic etch process can stop at the top surface of, or within, the first conductive rails 12. For example, the anisotropic etch process can stop on the first metal nitride strips 124. The second trenches 15 can be line trenches having a uniform vertical cross-sectional shape within vertical planes that are perpendicular to the second horizontal direction hd2. The uniform vertical cross-sectional shape of each second trench 15 can be invariant with translation along the second horizontal direction hd2. Each second trench 15 can vertically extend from the horizontal plane including the bottom surface of the second photoresist layer 199 to the horizontal plane including top surfaces of the first conductive rails 12. Each second trench 15 can have a vertical cross-sectional shape of an inverted trapezoid such that each second trench 15 has a pair of tapered lengthwise sidewalls and a lesser width at a bottom portion than at a top portion.

The first top conductive layer 18L is divided into a one-dimensional array of conductive rails, which are herein referred to as lower second conductive rail portions 18. Each lower second conductive rail portion 18 is subsequently incorporated into a respective second conductive rail that includes a respective upper second conductive rail portion to be subsequently formed thereabove. The first sacrificial rails 177' are divided into a two-dimensional array of first sacrificial material portions 177. Each sacrificial material portion 177 has a greater lateral width along the second horizontal direction hd2 in an upper portion thereof than in a lower portion.

Each vertical stack of a first memory-side conductive rail 17', a first phase change memory rails 16', and a first selector rails 14' is divided into a row of first memory pillar structures (14, 16, 17) that are laterally spaced apart long the first horizontal direction hd1. The combination of the first memory-side conductive rails 17', the first phase change memory rails 16', and the first selector rails 14' is divided into a two-dimensional array of first memory pillar structures (14, 16, 17), which may be a periodic two-dimensional array. The two-dimensional array of first memory pillar structures (14, 16, 17) can form a rectangular periodic two-dimensional array having a first pitch along the first horizontal direction hd1 and a second pitch along the second horizontal direction hd2.

As used herein, a "pillar" or a "pillar structure" refers to a structure that extends along a vertical direction such that each sidewall of the structure is vertical or is substantially vertical. As used herein, a sidewall is "substantially vertical" if the sidewall is tapered, i.e., tilted, with respect to a vertical direction by a tilt angle that is less than 10 degrees.

Each first memory pillar structure (14, 16, 17) includes, from bottom to top, a first selector pillar 14 that is a patterned portion of a first selector rail 14', a first phase change memory pillar 16 that is a patterned portion of a phase change memory rail 16', and a first memory-side conductive element 17 that is a patterned portion of a first barrier strip 17'. As used herein, a "plate" refers to a structure with a vertical thickness (such as a uniform vertical thickness) that is less than the maximum lateral dimension of the structure in any horizontal direction.

Each first selector pillar 14 is a selector element, i.e., an element that provides non-linear voltage-current characteristics such that the element functions as a conductor under first voltage bias conditions and as an insulator under second voltage bias conditions. In one embodiment, each first selector pillar 14 can include a vertical stack of a first selector-side conductive element 142 that is a patterned portion of a first selector-side conductive rail 142', a first selector element 144 that is a patterned portion of a first selector rail 144', and a first selector-memory conductive element 146 that is a patterned portion of a first selector-memory conductive rail 146'.

In one embodiment, the first selector-memory conductive element 146 comprises an upper amorphous carbon portion that contacts a top surface of the first selector element 144, and the first selector-side conductive element 142 comprises a lower amorphous carbon portion that contacts a bottom surface of the first selector element 144.

Each first phase change memory pillar 16 is a phase change memory element, i.e., a structure that changes the resistance depending on the phase of a material therein. In one embodiment, each first phase change memory pillar 16 can include a vertical stack of an optional first lower barrier liner plate 162 that is a patterned portion of a first optional lower barrier liner strip 162', a first phase change memory material pillar 164 that is a patterned portion of a first phase change memory material rail 164', and a first optional upper barrier liner plate 166 that is a patterned portion of a first upper barrier liner strip 166'.

Each first dielectric isolation structure (152, 154) has a laterally undulating height after the anisotropic etch process. Each first dielectric isolation structure (152, 154) can continuously extend underneath a plurality of second trenches 15. Each first memory pillar structure (14, 16, 17) comprises a vertical stack of structural elements including, from one end to another, a first selector-side conductive element 142, a first selector element 144, a first selector-memory conductive element 146, a first phase change memory element 16, and a first memory-side conductive element 17. In one embodiment, each of the first selector-side conductive element 142, the first selector-memory conductive element 146, and the first memory-side conductive element 17 within each vertical stack (14, 17, 17) of structural elements comprises amorphous carbon or diamond-like carbon (DLC). In one embodiment, the first selector element 144 within each vertical stack of structural elements comprises an ovonic threshold switch material. The first phase change memory element 16 within each vertical stack (14, 16, 17) of structural elements comprises a the first phase change memory material pillar 164 which comprises a material selected from germanium antimony telluride compounds, germanium antimony compounds, indium germanium telluride compounds, aluminum selenium telluride compounds, indium selenium telluride compounds, and aluminum indium selenium telluride compounds.

Referring to FIGS. 10A-10F, a second continuous dielectric liner layer can be optionally deposited on sidewalls and bottom surfaces of the second trenches 15 and over the lower second conductive rail portions 18. The second continuous dielectric liner layer includes a dielectric material such as silicon nitride, a dielectric metal oxide (such as aluminum oxide), or silicon oxide. The second continuous dielectric liner layer can be deposited by a conformal deposition method such as chemical vapor deposition (CVD) or atomic layer deposition (ALD). The thickness of the second continuous dielectric liner layer can be in a range from 1 nm to 10 nm, such as from 2 nm to 6 nm, although lesser and greater thicknesses can also be employed.

A second dielectric fill material layer can be deposited on the first continuous dielectric liner layer. The second dielectric fill material layer includes a planarizable dielectric material such as undoped silicate glass, doped silicate glass, or a spin-on glass (SOG). The second dielectric fill material layer can be deposited by a conformal deposition method or by a self-planarizing deposition method (such as spin coating). In one embodiment, the second continuous dielectric liner layer can include, and/or can consist essentially of, a material selected from silicon nitride and a dielectric metal oxide, and the second dielectric fill material layer can include, and/or can consist essentially of, a material selected from doped silicate glass and undoped silicate glass.

Portions of the second continuous dielectric liner layer and the second dielectric fill material layer can be removed from above the horizontal plane including top surfaces of the lower second conductive rail portions 18 by a planarization process. The planarization process can include chemical mechanical planarization (CMP) and/or a recess etch process. Each remaining portion of the second continuous dielectric liner layer constitutes a second dielectric liner 156, and each remaining portion of the second dielectric fill material layer constitutes a second dielectric fill material portion 158. Each contiguous set of a second dielectric liner 156 and a second dielectric fill material portion 158 constitutes a second dielectric isolation structure (156, 158), which is a dielectric isolation structure having a shape of a rail. A second dielectric isolation structure (156, 158) is formed in each of the second trenches 15 as a rail structure. The second dielectric isolation structures (156, 158) laterally extend along the second horizontal direction hd2, and are laterally spaced among one another along the first horizontal direction hd1. The top surfaces of the second dielectric isolation structures (156, 158) can be coplanar with the top surfaces of the lower second conductive rail portions 18.

Referring to FIGS. 11A-11F, an isotropic recess etch can be performed to vertically recess top surfaces of the second dielectric fill material portions 158. For example, if the second dielectric fill material portions 158 include silicon oxide, a timed wet etch employing dilute hydrofluoric acid can be employed to vertically recess top surfaces of the second dielectric fill material portions 158 below a horizontal plane including bottom surfaces of the first sacrificial material portions 177. The duration of the isotropic recess etch process can be selected so that top surfaces of the second dielectric fill material portions 158 are formed above the horizontal plane including top surfaces of the first selector-memory conductive elements 146.

Physically exposed portions of the second dielectric liners 156 can be removed by an isotropic etch process. If the second dielectric liners 156 include silicon nitride, a wet etch process employing hot phosphoric acid can be performed to remove the physically exposed portions of the second dielectric liners 156.

Subsequently, a selective isotropic trimming process can be performed to trim the material of the first memory-side conductive elements 17 without significantly removing materials of the first phase change memory pillars 16 and the second dielectric isolation structures (152, 154). The first memory-side conductive elements 17 are laterally recessed along the first horizontal direction hd1 by the selective isotropic trimming process. For example, the selective isotropic trimming process can include a plasma etch process or a wet etch process. The recess distance of the selective isotropic trimming process can be in a range from 10 nm to 50 nm, although lesser and greater recess distances can also be employed. The first memory-side conductive elements 17 as laterally recessed constitute laterally recessed pillars, i.e., pillars that are laterally recessed relative to a respective underlying pillar such as a first phase change memory pillar 16. A second cavity 159 including a laterally expanded region is formed above each second dielectric isolation structures (156, 158).

Generally, structural elements (such as the first memory-side conductive elements 17) formed by dividing laterally recessed rails (such as the first memory-side conductive rails 17') can be laterally recessed to form an array of laterally constricted structural elements (such as the first memory-side conductive elements 17 as laterally recessed at the processing steps of FIGS. 11A-11F). Portions of a rectangular array of first memory pillar structures (14, 16, 17) that underlie a horizontal plane including top surfaces of the second dielectric isolation structures (156, 158) are not recessed during formation of the array of laterally constricted structural elements.

Referring to FIGS. 12A-12F, the first sacrificial material portions 177 (which are remaining portions of the first sacrificial rails 177') can be removed by a selective isotropic etch process. The selective isotropic etch process etches the material of the first sacrificial material portions 177 without etching the material of the second dielectric fill material portions 158. For example, if the first sacrificial material portions 177 include amorphous silicon or polysilicon, a wet etch employing a KOH solution or a trimethyl-2-hydroxyethylammonium hydroxide (TMY) solution can be employed to remove the sacrificial material portions 177. Subsequently, the sacrificial liner 175 can be removed by an isotropic etch process. For example, if the sacrificial liner 175 includes silicon nitride, a wet etch employing hot phosphoric acid can be employed to remove the sacrificial liner 175. A tunnel region 259 is formed between each neighboring pair of first memory-side conductive elements 17 that are laterally spaced along the second horizontal direction. Each tunnel region 259 can connect a pair of second cavities 159 that are spaced apart along the first horizontal direction hd1. The second cavities 159 and the tunnel regions 259 collectively constitute a continuous cavity (159, 259) that laterally surrounds a two-dimensional array of first memory-side conductive elements 17.

Referring to FIGS. 13A-13F, a dielectric material is deposited at peripheral portions of the continuous cavity (159, 259) by an anisotropic deposition process. The dielectric material can include an undoped silicate glass material or a doped silicate glass material. The anisotropic deposition process can be, for example, a plasma enhanced chemical vapor deposition (PECVD) process. Excess portions of the deposited dielectric material can be removed from above the horizontal plane including the top surfaces of the lower second conductive rail portions 18. The remaining portion(s) of the deposited dielectric material is herein referred to as a first continuous cavity-containing dielectric material portion 150. At least one first encapsulated cavity (e.g., air gap) 359 is present at the level of the array of laterally constricted structural elements, i.e., the level of the first memory-side conductive elements 17, within the first continuous cavity-containing dielectric material portion 150. The first continuous cavity-containing dielectric material portion 150 can be formed in volumes of the second trenches 159 and volumes of the tunnel regions 259 formed by removal of the remaining portions of the first sacrificial rails 177' (i.e., the sacrificial material portions 177). In one embodiment, the first continuous cavity-containing dielectric material portion 150 can be formed on sidewalls of each laterally recessed structural element, i.e., the first memory-side conductive elements 17. In one embodiment, each of the at least one first encapsulated cavity 359 can be defined by a set of surfaces that entirely encloses a cavity. In one embodiment, the at least one first encapsulated cavity 359 may be formed as a continuous cavity that laterally surrounds a two-dimensional array of the first memory-side conductive elements 17.

Figure 13B:
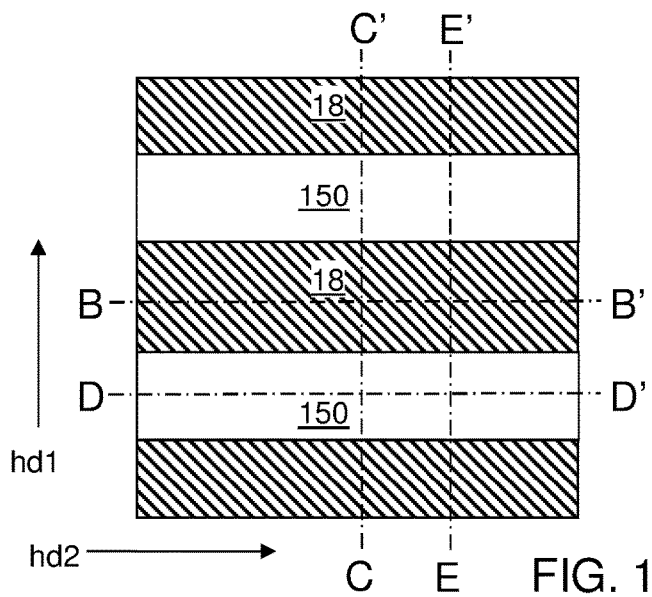
FIG. 13B is a vertical cross-sectional view of the first exemplary structure along the vertical plane B-B' of FIG. 13A.
Figure 13C:
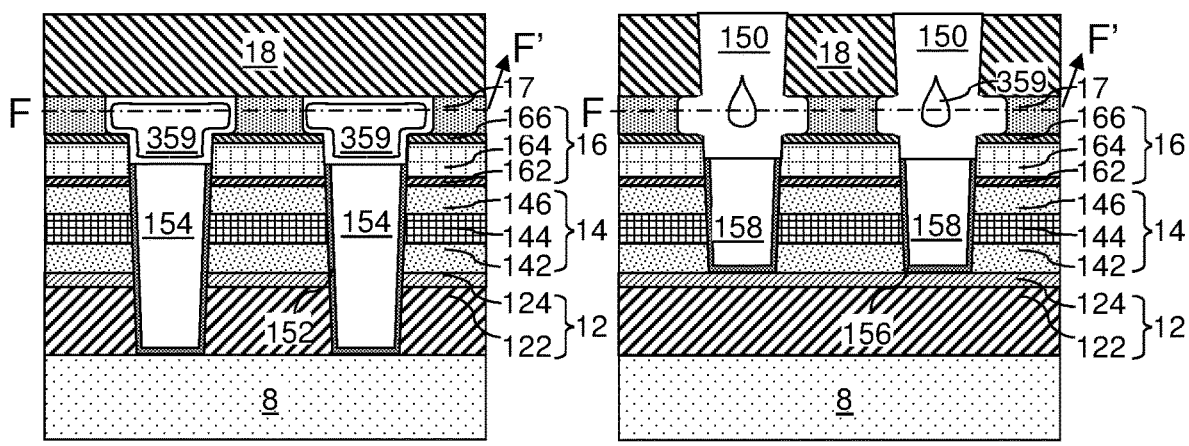
FIG. 13C is a vertical cross-sectional view of the first exemplary structure along the vertical plane C-C' of FIG. 13A.
Figure 13D:
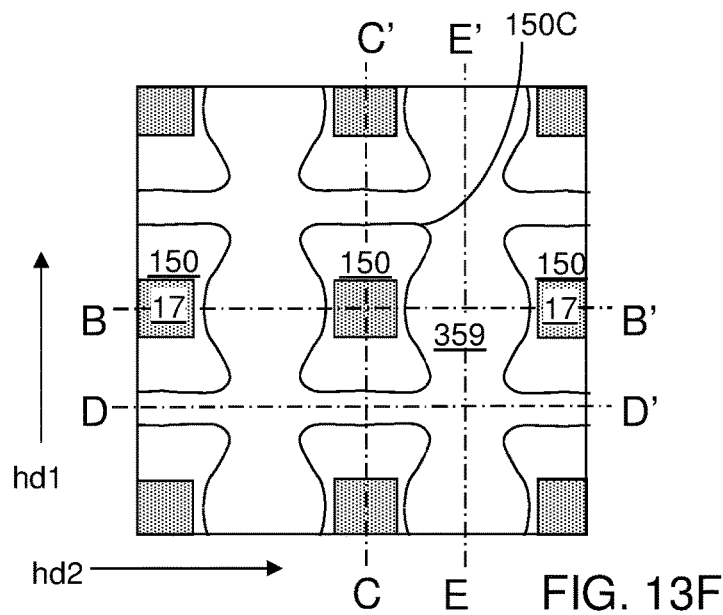
FIG. 13D is a vertical cross-sectional view of the first exemplary structure along the vertical plane D-D' of FIG. 13A.
Figure 13E:
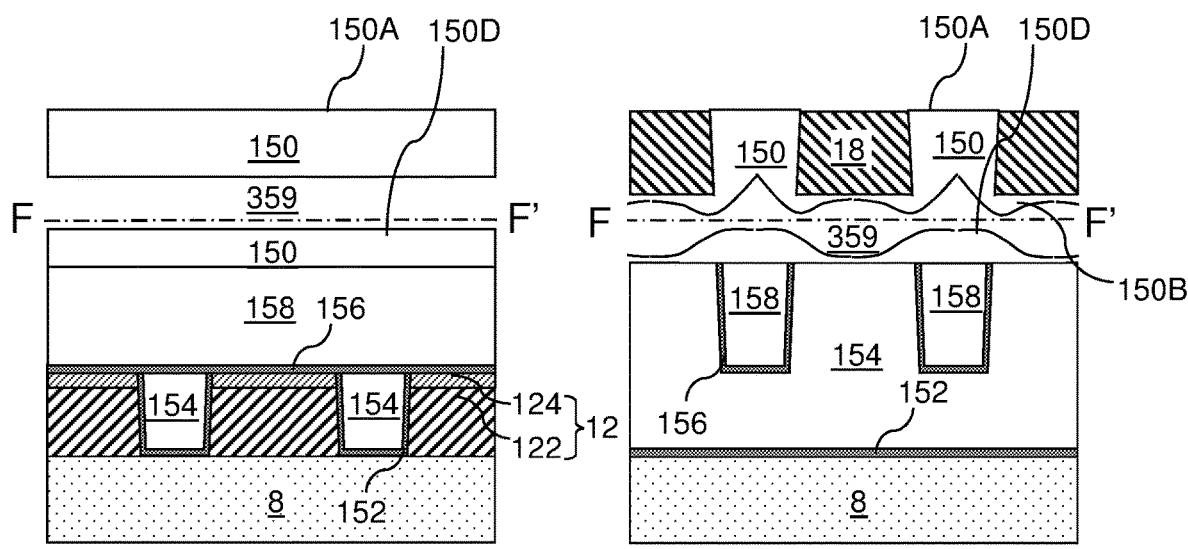
FIG. 13E is a vertical cross-sectional view of the first exemplary structure along the vertical plane E-E' of FIG. 13A.
Figure 15G:
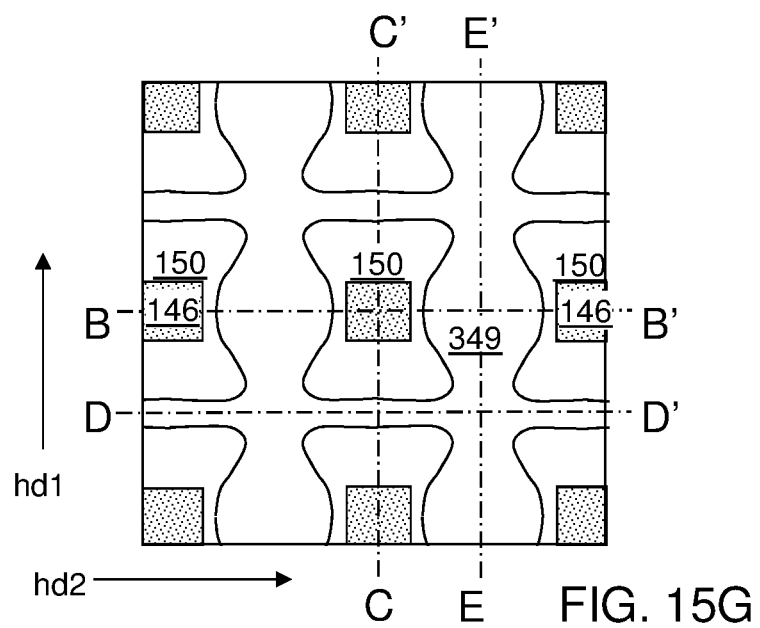
FIG. 15G is a horizontal cross-sectional view of the second exemplary structure along the horizontal plane G-G' of FIGS. 15B-15E.
Figure 16G:
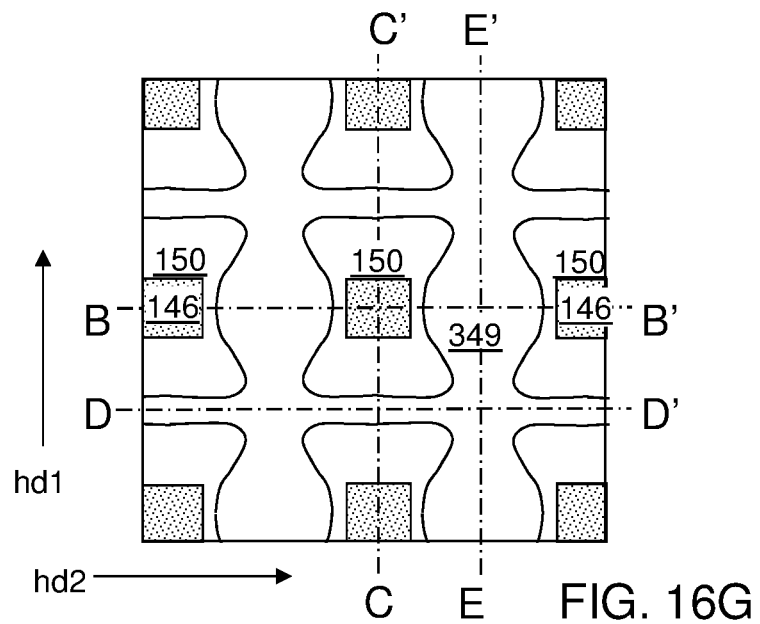
FIG. 16G is a horizontal cross-sectional view of the third exemplary structure along the horizontal plane G-G' of FIGS. 16B-16E.
Figure 16H:
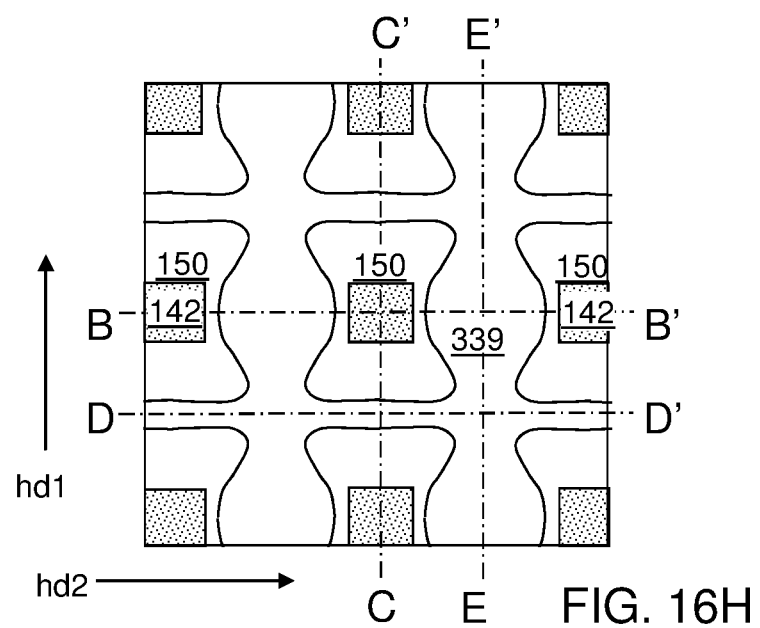
FIG. 16H is a horizontal cross-sectional view of the third exemplary structure along the horizontal plane H-H' of FIGS. 16B-16E.
Figure 17B:
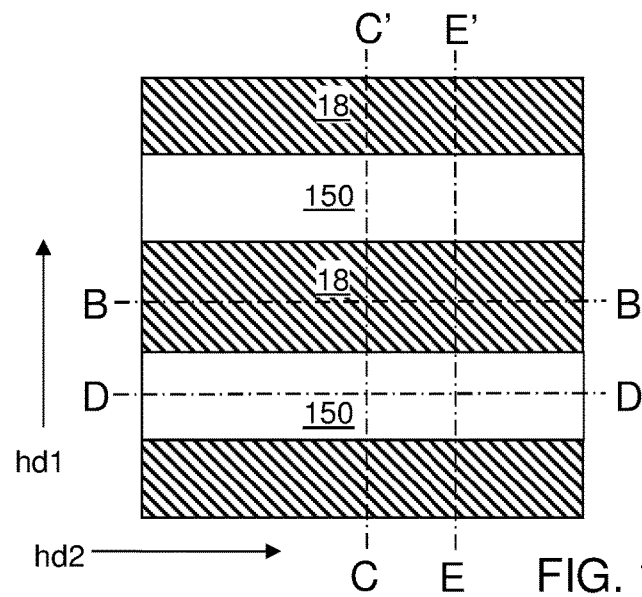
FIG. 17B is a vertical cross-sectional view of the fourth exemplary structure along the vertical plane B-B' of FIG. 17A.
Figure 17C:
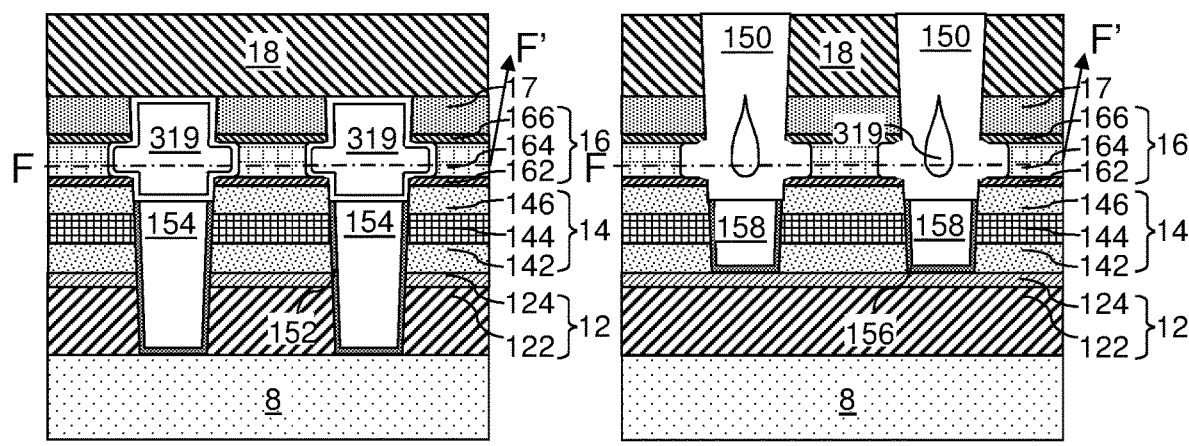
FIG. 17C is a vertical cross-sectional view of the fourth exemplary structure along the vertical plane C-C' of FIG. 17A.
Figure 18B:
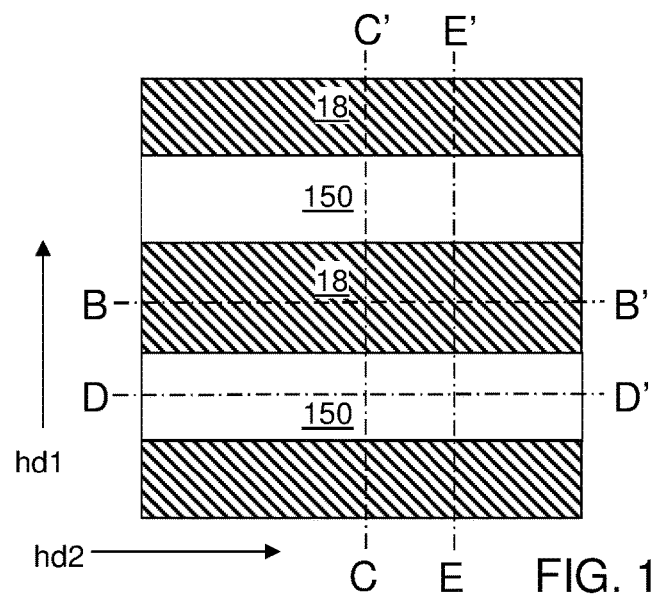
FIG. 18B is a vertical cross-sectional view of the fifth exemplary structure along the vertical plane B-B' of FIG. 18A.
Figure 18C:
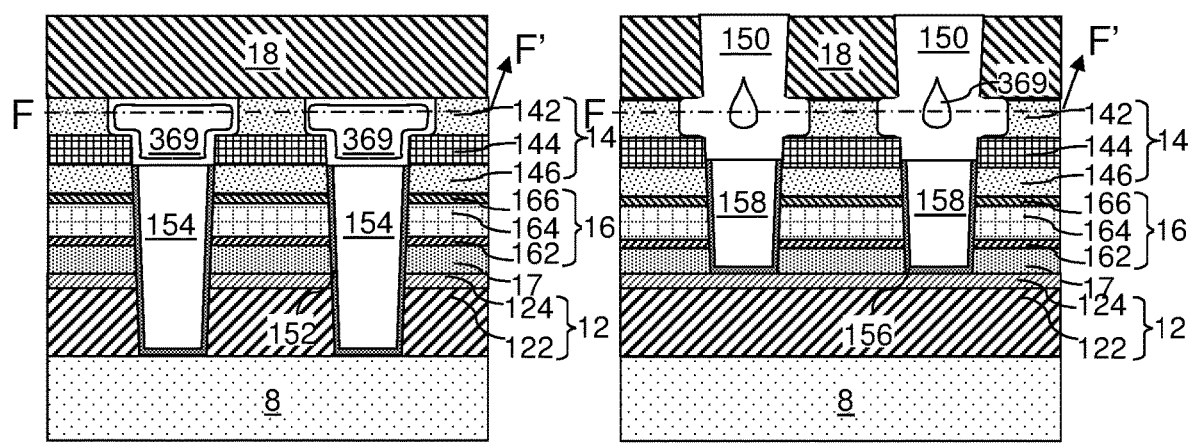
FIG. 18C is a vertical cross-sectional view of the fifth exemplary structure along the vertical plane C-C' of FIG. 18A.

In one embodiment shown in FIGS. 13D, 13E and 13F, the first continuous cavity-containing dielectric material portion 150 can comprise, from top to bottom, dielectric isolation material portions 150A located between each neighboring pair of the second conductive rails 18, a first horizontal liner portion 150B adjoined to the dielectric isolation material portions 150A and contacting bottom surfaces of the second conductive rails 18, a rectangular array of tubular dielectric portions 150C laterally surrounding a respective laterally constricted structural element (such as a first memory-side conductive element 17) and adjoined to the first horizontal liner portion 150B, and a second horizontal liner portion 150D overlying the first and second dielectric isolation structures (152, 154, 156, 158) and adjoined to the rectangular array of tubular dielectric portions 150C.

In one embodiment shown in FIG. 13F, each of the tubular dielectric portions 150C has a respective continuous outer sidewall having a butterfly-wing-shaped horizontal cross-sectional shape. As used herein, a "butterfly-wing-shaped" shape refers to a shape having a pair of substantially linear, laterally protruding portions along a horizontal direction (e.g., hd2) and a pair of laterally recessed portions along another horizontal direction (e.g., hd1) that is rotated from the pair of laterally protruding portions by 90 degrees in a horizontal plane. In one embodiment, each of the tubular dielectric portions has a greater lateral thickness on sidewalls of the laterally constricted structural elements (such as the first memory-side conductive elements 17) that are parallel to the second horizontal direction hd2 than on sidewalls of the laterally constricted structural elements that are parallel to the first horizontal direction hd1. In one embodiment, the first continuous cavity-containing dielectric material portion 150 encapsulates a first continuous cavity 359 at a level of the laterally constricted structural elements (such as the first memory-side conductive elements 17), and the first continuous cavity 359 laterally surrounds tubular dielectric portions within the rectangular array of tubular dielectric portions. The set of structural elements above the top surface of the substrate 8 constitutes a first-tier structure.

Referring to FIGS. 14A-14C, the set of processing steps employed to form the first-tier structure, i.e., the set of processing steps ranging from the processing steps of FIGS. 1A-1B to the processing steps of FIGS. 13A-13F, can be repeated with a 90 degree rotation in pattern to form a second-tier structure.

The second-tier structure can include upper second conductive rail portions 22 that are formed on a respective one of the lower second conductive rail portions 18. Each upper second conductive rail portion 22 can include a vertical stack of a second metal rail 222 and a second metal nitride strip 224. Each stack of a lower second conductive rail portion 18 and an upper second conductive rail portion 22 constitutes a second conductive rail (18, 22) that laterally extends along the second horizontal direction hd2.

A two-dimensional array of second memory pillar structures (24, 26, 27) is formed on the top surfaces of the second conductive rails (18, 22). Each second memory pillar structure (24, 26, 27) includes, from bottom to top, a second selector pillar 24, a second phase change memory pillar 26, and a second memory-side conductive element 27. In one embodiment, each second selector pillar 24 can include a vertical stack of a second selector-side conductive element 242, a second selector element 244, and a second selector-memory conductive element 246. In one embodiment, each second phase change memory pillar 26 can include a vertical stack of an optional second lower barrier liner plate 262, a second phase change memory material pillar 264, and a second optional upper barrier liner plate 266. Each second memory-side conductive element 27 can include any material that can be employed for the first memory-side conductive elements 17.

Third dielectric isolation structures (252, 254) can laterally extend along the second horizontal direction hd2, and can be located between neighboring pairs of upper second conducive rail portions 22. Each third dielectric isolation structure (252, 254) can include a third dielectric liner 252 and a third dielectric fill material portion 254. Fourth dielectric isolation structures (256, 256) can laterally extend along the first horizontal direction hd1, and can be located between neighboring pairs of rows of second memory pillar structures (24, 26, 27). Each fourth dielectric isolation structure (256, 258) can include a fourth dielectric liner 256 and a fourth dielectric fill material portion 258.

Third conductive rails 28 can overlie the two-dimensional array of second memory pillar structures (24, 26, 27), and can laterally extend along the first horizontal direction hd1. Each second memory pillar structures (24, 26, 27) can include a laterally recessed structural element such as a second memory-side conductive element 27. A second continuous cavity-containing dielectric material portion 250 can be formed on sidewalls of each laterally recessed structural element, i.e., a second memory-side conductive element 27, within the two-dimensional array of second memory pillar structures (24, 26, 27). In one embodiment, the second continuous cavity-containing dielectric material portion 250 includes an encapsulated cavity (e.g., second air gap) 459.

In one embodiment, the second continuous cavity-containing dielectric material portion 250 can comprise, from top to bottom, dielectric isolation material portions located between each neighboring pair of the third conductive rails 28, a first horizontal liner portion adjoined to the dielectric isolation material portions and contacting bottom surfaces of the third conductive rails 28, a rectangular array of tubular dielectric portions laterally surrounding a respective laterally constricted structural element (such as a second memory-side conductive element 27) and adjoined to the first horizontal liner portion, and a second horizontal liner portion overlying the third and fourth dielectric isolation structures (252, 254, 256, 258) and adjoined to the rectangular array of tubular dielectric portions.

In one embodiment, each of the tubular dielectric portions has a respective continuous outer sidewall having a butterfly-wing-shaped horizontal cross-sectional shape. In one embodiment, each of the tubular dielectric portions has a greater lateral thickness on sidewalls of the laterally constricted structural elements (such as the second memory-side conductive elements 27) that are parallel to the first horizontal direction hd1 than on sidewalls of the laterally constricted structural elements that are parallel to the second horizontal direction hd2. In one embodiment, the second continuous cavity-containing dielectric material portion 250 encapsulates a second continuous cavity 459 at a level of laterally constricted structural elements (such as the second memory-side conductive elements 27), and the second continuous cavity 459 laterally surrounds tubular dielectric portions within the rectangular array of tubular dielectric portions. The set of structural elements above the first-tier structure constitutes a second-tier structure.

The phase change memory array can include a rectangular array of second memory pillar structures (24, 26, 27) overlying top surfaces of the second conductive rails (18, 22). Each second memory pillar structure (24, 26, 27) comprises a vertical stack of additional structural elements including, from one end to another, a second selector-side conductive element 242, a second selector element 244, a second selector-memory conductive element 246, a second phase change memory element 26, and a second memory-side conductive element 27. At least one structural element such as the second memory-side conductive element 27, within the vertical stack of additional structural elements (24, 26, 27) comprises another laterally constricted structural element (such as a second memory-side conductive element 27) having laterally recessed sidewalls relative to sidewalls of a respective immediately vertically underlying structural element (such as a second phase change memory element 26) within the vertical stack of the additional structural elements (24, 26, 27). The third conductive rails 28 laterally extend along the first horizontal direction hd1 and overlie top surfaces of the rectangular array of second memory pillar structures (24, 26, 27).

Referring to FIGS. 15A-15G, a second exemplary structure according to an embodiment of the present disclosure is illustrated, which can be derived from the first exemplary structure by vertically recessing the first in-process dielectric fill material portions 154' below a horizontal plane including bottom surfaces of the first selector-memory conductive rails 146' at the processing steps of FIGS. 4A-4C. Thus, top surfaces of the first dielectric fill material portions 154 are formed below the horizontal plane including bottom surfaces of the first selector-memory conductive rail 146'. Physically exposed portions of the first in-process dielectric liners 152' can be removed by an isotropic etch process. Each remaining portion of the first in-process dielectric liners 152' constitutes a first dielectric liner 152. Each contiguous combination of a first dielectric liner 152 and a first dielectric fill material portion 154 constitutes a first dielectric isolation structure (152, 154). First line cavities can be formed above the first dielectric isolation structures (152, 154). Subsequently, processing steps from the processing steps of FIGS. 5A-5C to the processing steps of FIGS. 13A-13F can be performed to provide the second exemplary structure illustrated in FIGS. 15A-15G. The first selector-memory conductive rails 146' are laterally recessed concurrently with lateral recessing of the first memory-side conductive rails 17'. Further, the first selector-memory conductive elements 146 are laterally recessed concurrently with lateral recessing of the first memory-side conductive elements 17. The second exemplary structure includes, in addition to the first encapsulated cavity 359, at least one second encapsulated cavity 349 located at the level of a two-dimensional array of first selector-memory conductive elements 146. In this embodiment, the combination of the first selector-memory conductive elements 146 and first memory-side conductive elements 17 comprises an array of laterally recessed structural elements.

Referring to FIGS. 16A-16H, a third exemplary structure according to an embodiment of the present disclosure is illustrated, which can be derived from the first exemplary structure by vertically recessing the first in-process dielectric fill material portions 154' below a horizontal plane including bottom surfaces of the first selector-side conductive rails 142' at the processing steps of FIGS. 4A-4C. Thus, top surfaces of the first dielectric fill material portions 154 are formed below the horizontal plane including bottom surfaces of the first selector-side conductive rail 142'. Physically exposed portions of the first in-process dielectric liners 152' can be removed by an isotropic etch process. Each remaining portion of the first in-process dielectric liners 152' constitutes a first dielectric liner 152. Each contiguous combination of a first dielectric liner 152 and a first dielectric fill material portion 154 constitutes a first dielectric isolation structure (152, 154). First line cavities can be formed above the first dielectric isolation structures (152, 154). Subsequently, processing steps from the processing steps of FIGS. 5A-5C to the processing steps of FIGS. 13A-13F can be performed to provide the third exemplary structure illustrated in FIGS. 16A-16H. The first selector-side conductive rails 142' and the first selector-memory conductive rails 146' are laterally recessed concurrently with lateral recessing of the first memory-side conductive rails 17'. Further, the first selector-side conductive elements 142 and the first selector-memory conductive elements 146 are laterally recessed concurrently with lateral recessing of the first memory-side conductive elements 17. The third exemplary structure includes, in addition to the first encapsulated cavity 359, at least one second encapsulated cavity 349 located at the level of a two-dimensional array of first selector-memory conductive elements 146, and at least one third encapsulated cavity 339 located at the level of a two-dimensional array of first selector-side conductive elements 142. In this embodiment, the combination of the first selector-memory conductive elements 146, first selector-side conductive elements 142 and first memory-side conductive elements 17 comprises an array of laterally recessed structural elements.

Referring to FIGS. 17A-17F, a fourth exemplary structure according to an embodiment of the present disclosure is illustrated, which can be derived from the first exemplary structure by vertically recessing the first in-process dielectric fill material portions 154' below a horizontal plane including bottom surfaces of the first phase change memory material rail 164' at the processing steps of FIGS. 4A-4C. Thus, top surfaces of the first dielectric fill material portions 154 are formed below the horizontal plane including bottom surfaces of the first selector-side conductive rail 142'. Physically exposed portions of the first in-process dielectric liners 152' can be removed by an isotropic etch process. Each remaining portion of the first in-process dielectric liners 152' constitutes a first dielectric liner 152. Each contiguous combination of a first dielectric liner 152 and a first dielectric fill material portion 154 constitutes a first dielectric isolation structure (152, 154). First line cavities can be formed above the first dielectric isolation structures (152, 154).

In lieu of the processing steps of FIGS. 5A-5C, the first phase change memory material rails 164' are laterally recessed selective to other components within the first array level rail stacks (14', 16', 17', 173'). Specifically, a selective isotropic etch process is performed to etch the material of the first phase change memory material rails 164' without etching the materials of the other components in the first array level rail stacks (14', 16', 17', 173'). Subsequently, the processing steps from the processing steps of FIGS. 5A-5C to the processing steps of FIGS. 11A-11F can be performed with a modification to the isotropic etch process of FIGS. 11A-11F such that the first phase change memory pillars 16 are laterally recessed selective to other components within the first memory pillar structure (14, 16, 17). Processing steps of FIGS. 12A-12F and FIGS. 13A-13F can be performed to provide the fourth exemplary structure illustrated in FIGS. 17A-17F. The fourth exemplary structure includes at least one encapsulated cavity 319 located at the level of a two-dimensional array of first phase change memory pillars 16. In this embodiment, the two-dimensional array of first phase change memory pillars 16 comprises an array of laterally recessed structural elements.

Referring to FIGS. 18A-18F, a fifth exemplary structure according to an embodiment of the present disclosure is illustrated, which can be derived from the first exemplary structure of FIGS. 1A and 1B by changing the order of layers in the first vertical stack (12L, 14L, 16L, 17L, 173L) such that a modified first vertical stack (12L, 17L, 16L, 14L, 173L) includes, from bottom to top, a first bottom conductive layer 12L, a first memory-side conductive layer 17L, a first phase change memory layer 16L, a first selector layer stack 14L, and an optional first hard mask layer 173L. The processing steps of FIGS. 2A-2C and 3A-3C can be performed mutatis mutandis. The processing steps of FIGS. 4A-4C can be performed with a modification such that the top surfaces of the first dielectric fill material portions 154 are formed below the horizontal plane including bottom surfaces of the first selector-side conductive rails. Each contiguous combination of a first dielectric liner 152 and a first dielectric fill material portion 154 constitutes a first dielectric isolation structure (152, 154). First line cavities can be formed above the first dielectric isolation structures (152, 154). The processing steps of FIGS. 5A-5C can be performed with a modification to the etch chemistry to laterally recess the first selector-side conductive rails. A series of processing steps from the processing steps of FIGS. 6A-6C to the processing steps of FIGS. 11A-11F can be performed with a modification to laterally recess first selector-side conductive elements. Subsequently, processing steps from the processing steps of FIGS. 12A-12F to the processing steps of FIGS. 13A-13F can be performed to provide the fifth exemplary structure illustrated in FIGS. 18A-18F. The fifth exemplary structure includes at least one second encapsulated cavity 369 located at the level of a two-dimensional array of first selector-side conductive elements 142. In this embodiment, the two-dimensional array of first selector-side conductive elements 142 comprises an array of laterally recessed structural elements Generally, at least one rail selected from each first array level rail stack (14', 16', 17', 173') can be laterally recessed relative to underlying, and/or overlying rail(s). The at least one laterally recessed rail can be selected from a first selector-side conductive rail 142, a first selector-memory conductive rail 146, a first phase change memory material rail 164' within a first phase change memory rail 16', and a first memory-side conductive rail 17' within each first rail stack relative to a respective immediately vertically underlying rail. Further, at least one structural element formed by dividing laterally recessed rails can be laterally recessed to form an array of laterally constricted structural elements. Portions of a rectangular array of first memory pillar structures (14, 16, 17) that underlie a horizontal plane including top surfaces of the second dielectric isolation structures (156, 158) are not recessed during formation of the array of laterally constricted structural elements. The first sacrificial rails 177' can be formed above the second dielectric isolation structures (156, 158), and sacrificial material portions 177 can be formed to form tunnel regions 259 after formation of the array of laterally constricted structural elements.

Referring to all drawings and according to various embodiments of the present disclosure, a phase change memory device is provided, which comprises: first conductive rails 12 laterally extending along a first horizontal direction hd1 over a substrate 8; a rectangular array of first memory pillar structures (14, 16, 17) overlying top surfaces of the first conductive rails 12, wherein each first memory pillar structure (14, 16, 17) comprises a vertical stack of structural elements including, from one end to another, a first selector-side conductive element 142, a first selector element 144, a first selector-memory conductive element 146, a first phase change memory element 16, and a first memory-side conductive element 17, wherein at least one structural element within the vertical stack (142, 144, 146, 16, 17) of structural elements is a laterally constricted structural element having laterally recessed sidewalls relative to sidewalls of a respective immediately vertically underlying structural element within the vertical stack (142, 144, 146, 16, 17) of structural elements; and second conductive rails (18, 22) laterally extending along a second horizontal direction hd2 and overlying top surfaces of the rectangular array of first memory pillar structures (14, 16, 17).

In one embodiment, the laterally recessed sidewalls of the laterally constricted structural element comprises: first laterally recessed sidewalls that are parallel to the first horizontal direction hd1 and laterally recessed with respect to first sidewalls of the respective immediately vertically underlying structural element by a first lateral recess distance; and second laterally recessed sidewalls that are parallel to the second horizontal direction hd2 and laterally recessed with respect to second sidewalls of the respective immediately vertically underlying structural element by a second lateral recess distance.

In one embodiment, the phase change memory device further comprises: first dielectric isolation structures (152, 154) extending along the first horizontal direction hd1 and located between each neighboring pair of first conductive rails 12; and second dielectric isolation structures (156, 158) extending along the second horizontal direction hd2 and located between neighboring rows of the first memory pillar structures (14, 16, 17), wherein each laterally constricted structural element is located above a horizontal plane including top surfaces of the first dielectric isolation structures (152, 154) and above a horizontal plane including top surfaces of the second dielectric isolation structures (156, 158).

In one embodiment, the phase change memory device further comprises a continuous cavity-containing dielectric material portion 150 that includes: dielectric isolation material portions located between each neighboring pair of the second conductive rails (18, 22); a first horizontal liner portion adjoined to the dielectric isolation material portions and contacting bottom surfaces of the second conductive rails (18, 22); a rectangular array of tubular dielectric portions laterally surrounding a respective laterally constricted structural element and adjoined to the first horizontal liner portion; and a second horizontal liner portion overlying the first and second dielectric isolation structures (152, 154, 156, 158) and adjoined to the rectangular array of tubular dielectric portions.

In one embodiment, each of the tubular dielectric portions has a respective continuous outer sidewall having a butterfly-wing-shaped horizontal cross-sectional shape, and each of the tubular dielectric portions has a greater lateral thickness on sidewalls of the laterally constricted structural elements that are parallel to the second horizontal direction hd2 than on sidewalls of the laterally constricted structural elements that are parallel to the first horizontal direction hd1.

In one embodiment, the continuous cavity-containing dielectric material portion encapsulates a first continuous cavity (359, 319, 369) at a level of the laterally constricted structural elements; and the first continuous cavity (359, 319, 369) laterally surrounds tubular dielectric portions within the rectangular array of tubular dielectric portions. In one embodiment, each of the second conductive rails (18, 22) comprises a vertical stack of a lower second conductive rail 18 and an upper second conductive rail 22, and top surfaces of the dielectric isolation material portions are coplanar with interfaces between the lower second conductive rails 18 and the upper second conductive rails 22.

In one embodiment, the phase change memory device further comprises: a rectangular array of second memory pillar structures (24, 26, 27) overlying top surfaces of the second conductive rails (18, 22), wherein each second memory pillar structure (24, 26, 27) comprises a vertical stack (242, 244, 246, 26, 27) of additional structural elements including, from one end to another, a second selector-side conductive element 242, a second selector element 244, a second selector-memory conductive element 244, a second phase change memory element 26, and a second memory-side conductive element 27, wherein at least one structural element within the vertical stack (242, 244, 246, 26, 27) of additional structural elements comprises another laterally constricted structural element having laterally recessed sidewalls relative to sidewalls of a respective immediately vertically underlying structural element within the vertical stack of the additional structural elements. The phase change memory device can further comprise third conductive rails 28 laterally extending along the first horizontal direction hd1 and overlying top surfaces of the rectangular array of second memory pillar structures (24, 26, 27).

In one embodiment, the laterally constricted structural element within each vertical stack (142, 144, 146, 16, 17) of structural elements comprises the first memory-side conductive element 17.

In one embodiment, the laterally constricted structural element within each vertical stack (142, 144, 146, 16, 17) of structural elements comprises the first phase change memory element 16.

In one embodiment, the laterally constricted structural element within each vertical stack (142, 144, 146, 16, 17) of structural elements comprises the first selector-side conductive element 142.

In one embodiment, two structural elements within the vertical stack (142, 144, 146, 16, 17) of structural elements are laterally constricted structural elements, and comprise the first selector-memory conductive element 146 and one of the first memory-side conductive element 17 and the first selector-side conductive element 142.

In one embodiment, each of the first selector-side conductive element 142, the first selector-memory conductive element 146, and the first memory-side conductive element 17 within each vertical stack (142, 144, 146, 16, 17) of structural elements comprises amorphous carbon or diamond-like carbon (DLC). The first selector element 144 within each vertical stack (142, 144, 146, 16, 17) of structural elements can comprise an ovonic threshold switch material. The first phase change memory element 16 within each vertical stack (142, 144, 146, 16, 17) of structural elements comprises a material selected from germanium antimony telluride compounds, germanium antimony compounds, indium germanium telluride compounds, aluminum selenium telluride compounds, indium selenium telluride compounds, and aluminum indium selenium telluride compounds.

The laterally constricted structural element induces constriction of vertical electrical current through each memory pillar structure {(14, 16, 17), (24, 26, 27)}. In one embodiment, the laterally constricted structural element can have an interface with a phase change memory element, and the electrical current density passing through the phase change memory element can increase locally at the interface with the laterally constricted structural element. In this case, an interfacial region of the phase change memory element near the interface with the laterally constricted structural element can be programmed with less electrical current than a phase change memory element that does not have an interface with a structure with a lesser horizontal cross-sectional shape.

In one embodiment, the laterally constricted structural element can have an interface with a selector element, and the electrical current density passing through the selector element can increase locally at the interface with the laterally constricted structural element. In this case, an interfacial region of the selector element near the interface with the laterally constricted structural element can change electrical states with less electrical current than a selector element that does not have an interface with a structure with a lesser horizontal cross-sectional shape.

In one embodiment, the laterally constricted structural element can be a phase change memory element, and the electrical current density passing through the phase change memory element can increase due to a reduced horizontal cross-sectional area. In this case, the phase change memory element can be programmed with less electrical current than a phase change memory element without a reduced horizontal cross-sectional area.

In one embodiment, the laterally constricted structural element can be a selector element, and the electrical current density passing through the selector element can increase due to a reduced horizontal cross-sectional area. In this case, the selector element can change electrical states with less electrical current than a selector element without a reduced horizontal cross-sectional area.

Figure 19A:
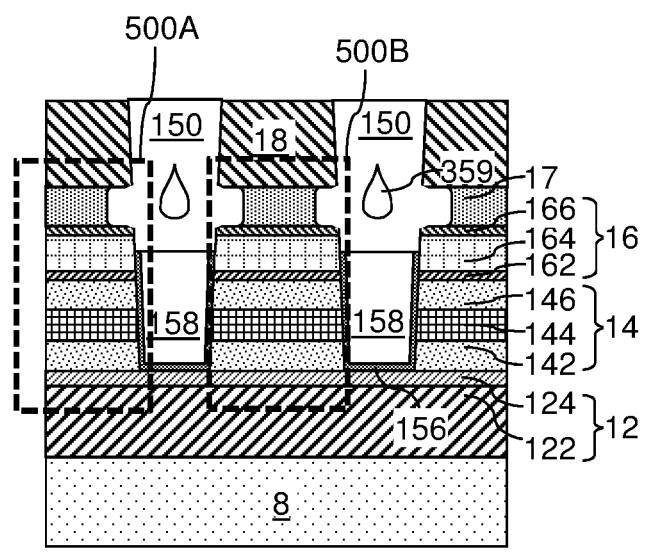
FIG. 19A is a vertical cross-sectional view of the first exemplary structure with two laterally adjacent cells in the set state.
Figure 19B:
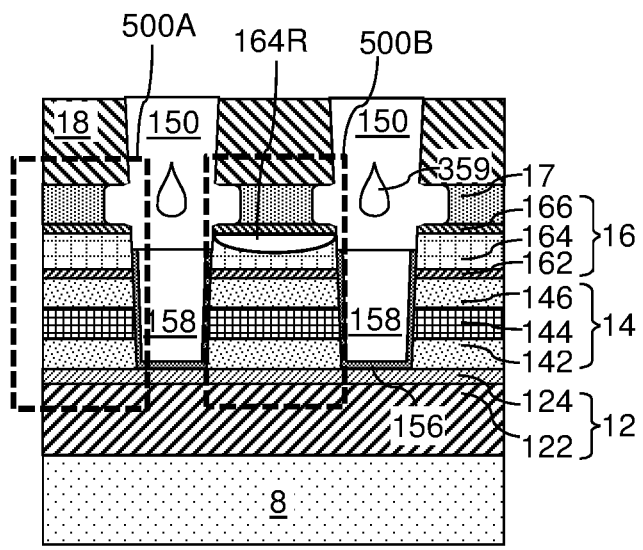
FIG. 19B is a vertical cross-sectional view of the first exemplary structure with after one of the two laterally adjacent cells is placed into the reset state.

FIGS. 19A and 19B illustrate a method of programming a memory cell into the reset state. FIG. 19A is a vertical cross-sectional view of the first exemplary structure of FIG. 13B with two laterally adjacent memory cells 500A and 500B in the set state. In this configuration, first phase change memory material pillar 164 of each memory cell 500A and 500B is in the crystalline state.

FIG. 19B is a vertical cross-sectional view of the first exemplary structure with after the second memory cell 500B is programmed into the reset state while the first memory cell 500A remains in the set state. In one embodiment, the entire phase change material pillar 164 in the second memory cell 500B does not have to undergo a phase transition. In contrast, only an upper, roughly semi-circular shaped upper part 164R of the phase change material pillar 164 of the second memory cell 500B around the interface with the upper electrode (e.g., with the first memory-side conductive element 17) can be converted from crystalline to amorphous state during the reset operation to reset the entire second memory cell 500B. The lower part of the phase change material pillar 164 can remain in the crystalline state.

The method of programming the second memory cell 500 from the set state to the reset state includes applying a reset voltage through a selected one of the first memory pillar structures between the respective first and second conductive rails (12, 18). The reset voltage converts only an upper part 164R of the first phase change memory element 164 of the selected one of the first memory pillar structures from a crystalline state to an amorphous state to reset the second memory cell 500B located in the selected one of the first memory pillar structures to the reset state, while a lower part of the phase change memory element 164 remains in the crystalline state.

Therefore, a high reset voltage and current are not required to elevate temperature of the whole second memory cell 500B, but a lower reset voltage and current can be used to melt the phase change material layer part near its boundary with the upper electrode to reset the second memory cell 500B. A localized current density enhancement at the laterally constricted structural element in the memory pillar structures {(14, 16, 17), (24, 26, 27)} can reduce operational current and/or operational voltage (e.g., the reset current and voltage) of the phase change memory device of the embodiments of the present disclosure. Further, the various continuous cavities (e.g., air gaps) (359, 349, 339, 319, 369) of the embodiments of the present disclosure can function as effective thermal insulator structures, and thus, decrease or eliminate the program disturb effect.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A phase change memory device, comprising:
   first conductive rails laterally extending along a first horizontal direction over a substrate;
   a rectangular array of first memory pillar structures overlying top surfaces of the first conductive rails, wherein each first memory pillar structure comprises a vertical stack of structural elements including, from one end to another, a first selector-side conductive element, a first selector element, a first selector-memory conductive element, a first phase change memory element, and a first memory-side conductive element, wherein at least one structural element within the vertical stack of structural elements is a laterally constricted structural element having laterally recessed sidewalls relative to sidewalls of a respective immediately vertically underlying structural element within the vertical stack of structural elements;
   second conductive rails laterally extending along a second horizontal direction and overlying top surfaces of the rectangular array of first memory pillar structures;
   first dielectric isolation structures extending along the first horizontal direction and located between each neighboring pair of the first conductive rails;
   second dielectric isolation structures extending along the second horizontal direction and located between neighboring rows of the first memory pillar structures, wherein each laterally constricted structural element is located above a horizontal plane including top surfaces of the first dielectric isolation structures and above a horizontal plane including top surfaces of the second dielectric isolation structures; and
   a continuous cavity-containing dielectric material portion that includes:
      dielectric isolation material portions located between each neighboring pair of the second conductive rails;
      a first horizontal liner portion adjoined to the dielectric isolation material portions and contacting bottom surfaces of the second conductive rails;
      a rectangular array of tubular dielectric portions laterally surrounding a respective laterally constricted structural element and adjoined to the first horizontal liner portion; and
      a second horizontal liner portion overlying the first and second dielectric isolation structures and adjoined to the rectangular array of tubular dielectric portions.

2. The phase change memory device of claim 1, wherein the laterally recessed sidewalls of the laterally constricted structural element comprise at least one of:
   first laterally recessed sidewalls that are parallel to the first horizontal direction and laterally recessed with respect to first sidewalls of the respective immediately vertically underlying structural element by a first lateral recess distance; and
   second laterally recessed sidewalls that are parallel to the second horizontal direction and laterally recessed with respect to second sidewalls of the respective immediately vertically underlying structural element by a second lateral recess distance.

3. The phase change memory device of claim 1, wherein each of the tubular dielectric portions has a respective continuous outer sidewall having a butterfly-wing-shaped horizontal cross-sectional shape.

4. The phase change memory device of claim 3, wherein each of the tubular dielectric portions has a greater lateral thickness on sidewalls of the laterally constricted structural elements that are parallel to the second horizontal direction than on sidewalls of the laterally constricted structural elements that are parallel to the first horizontal direction.

5. The phase change memory device of claim 1, wherein:
each of the second conductive rails comprises a vertical stack of a lower second conductive rail and an upper second conductive rail; and
top surfaces of the dielectric isolation material portions are coplanar with interfaces between the lower second conductive rails and the upper second conductive rails.

6. The phase change memory device of claim 1, further comprising:
a rectangular array of second memory pillar structures overlying top surfaces of the second conductive rails, wherein each second memory pillar structure comprises a vertical stack of additional structural elements including, from one end to another, a second selector-side conductive element, a second selector element, a second selector-memory conductive element, a second phase change memory element, and a second memory-side conductive element, wherein at least one structural element within the vertical stack of additional structural elements comprises another laterally constricted structural element having laterally recessed sidewalls relative to sidewalls of a respective immediately vertically underlying structural element within the vertical stack of the additional structural elements; and
third conductive rails laterally extending along the first horizontal direction and overlying top surfaces of the rectangular array of second memory pillar structures.

7. The phase change memory device of claim 1, wherein the laterally constricted structural element within each vertical stack of structural elements comprises the first memory-side conductive element.

8. The phase change memory device of claim 1, wherein the laterally constricted structural element within each vertical stack of structural elements comprises the first phase change memory element.

9. The phase change memory device of claim 1, wherein the laterally constricted structural element within each vertical stack of structural elements comprises the first selector-side conductive element.

10. The phase change memory device of claim 1, wherein at least two structural elements within the vertical stack of structural elements are laterally constricted structural elements, and comprise the first selector-memory conductive element and at least one of the first memory-side conductive element and the first selector-side conductive element.

11. The phase change memory device of claim 1, wherein:
each of the first selector-side conductive element, the first selector-memory conductive element, and the first memory-side conductive element within each vertical stack of structural elements comprises amorphous carbon or diamond-like carbon (DLC);
the first selector element within each vertical stack of structural elements comprises an ovonic threshold switch material; and
the first phase change memory element within each vertical stack of structural elements comprises a material selected from germanium antimony telluride compounds, germanium antimony compounds, indium germanium telluride compounds, aluminum selenium telluride compounds, indium selenium telluride compounds, and aluminum indium selenium telluride compounds.

* * * * *